United States Patent
Yamazaki et al.

(10) Patent No.: US 9,496,409 B2
(45) Date of Patent: Nov. 15, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Daisuke Matsubayashi, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 34 days.

(21) Appl. No.: 14/220,544

(22) Filed: Mar. 20, 2014

(65) Prior Publication Data

US 2014/0291671 A1    Oct. 2, 2014

(30) Foreign Application Priority Data

Mar. 26, 2013    (JP) .................. 2013-064522

(51) Int. Cl.
*H01L 29/786* (2006.01)
*H01L 29/66* (2006.01)

(52) U.S. Cl.
CPC ..... *H01L 29/7869* (2013.01); *H01L 29/66969* (2013.01); *H01L 29/78648* (2013.01)

(58) Field of Classification Search
CPC .......... H01L 29/7869; H01L 29/78693; H01L 29/78648; H01L 29/78696; H01L 29/66969

See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 5,821,159 A * | 10/1998 | Ukita | H01L 21/28008 257/E21.19 |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Stephen W Smoot
*Assistant Examiner* — Sun M Kim
(74) *Attorney, Agent, or Firm* — Robinson Intellectual Property Law Office; Eric J. Robinson

(57) ABSTRACT

A first source electrode is formed in contact with a semiconductor layer; a first drain electrode is formed in contact with the semiconductor layer; a second source electrode which extends beyond an end portion of the first source electrode to be in contact with the semiconductor layer is formed; a second drain electrode which extends beyond an end portion of the first drain electrode to be in contact with the semiconductor layer is formed; a first sidewall is formed in contact with a side surface of the second source electrode and the semiconductor layer; a second sidewall is formed in contact with a side surface of the second drain electrode and the semiconductor layer; and a gate electrode is formed to overlap the first sidewall, the second sidewall, and the semiconductor layer with a gate insulating layer provided therebetween.

16 Claims, 20 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,855,969 B2 | 2/2005 | Inoh |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,087,475 B2 | 8/2006 | Inoh |
| 7,105,868 B2 | 9/2006 | Nause et al. |
| 7,211,825 B2 | 5/2007 | Shih et al. |
| 7,238,557 B2 | 7/2007 | Hayakawa |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 8,501,564 B2 | 8/2013 | Suzawa et al. |
| 8,901,558 B2 * | 12/2014 | Yamazaki ........... H01L 29/4908 257/347 |
| 8,921,853 B2 * | 12/2014 | Yamazaki ..................... 257/347 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0183080 A1 * | 9/2004 | Kusumoto .......... H01L 21/0485 257/77 |
| 2005/0017302 A1 | 1/2005 | Hoffman |
| 2005/0056826 A1 | 3/2005 | Appenzeller et al. |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0175609 A1 * | 8/2006 | Chan ................. H01L 29/66787 257/59 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0032665 A1 | 2/2010 | Yamazaki et al. |
| 2010/0032668 A1 | 2/2010 | Yamazaki et al. |
| 2010/0051911 A1 * | 3/2010 | Cho .................. H01L 51/0545 257/40 |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |
| 2011/0114943 A1 | 5/2011 | Yamazaki et al. |
| 2011/0133177 A1 * | 6/2011 | Suzawa .............. H01L 27/1225 257/43 |
| 2011/0156022 A1 * | 6/2011 | Yamazaki ......... H01L 29/42384 257/43 |
| 2014/0021475 A1 * | 1/2014 | Moon ................. H01L 29/786 257/59 |
| 2014/0103337 A1 * | 4/2014 | Yamazaki ......... H01L 21/02565 257/43 |
| 2014/0103338 A1 * | 4/2014 | Yamazaki ......... H01L 21/02565 257/43 |
| 2014/0103340 A1 * | 4/2014 | Yamazaki ........... H01L 29/7869 257/43 |
| 2014/0106504 A1 * | 4/2014 | Yamazaki ............. C23C 14/086 438/104 |
| 2014/0110706 A1 * | 4/2014 | Yamazaki ........... H01L 29/7869 257/43 |
| 2014/0121787 A1 * | 5/2014 | Yamazaki ........... H04L 12/2825 700/19 |
| 2014/0131700 A1 * | 5/2014 | Yamazaki ........... H01L 29/4908 257/43 |
| 2014/0131702 A1 * | 5/2014 | Matsubayashi ..... H01L 29/7869 257/43 |
| 2014/0138675 A1 * | 5/2014 | Yamazaki ......... H01L 29/66757 257/43 |
| 2014/0151691 A1 * | 6/2014 | Matsubayashi ..... H01L 29/7869 257/43 |
| 2014/0183530 A1 * | 7/2014 | Yamazaki ........... H01L 29/7869 257/43 |

(56) References Cited

U.S. PATENT DOCUMENTS

2014/0291673 A1* 10/2014 Yamazaki ............ H01L 29/7869
257/43

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-cyrstalline $InGaO_3(ZnO)5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.,", Journals of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

1196

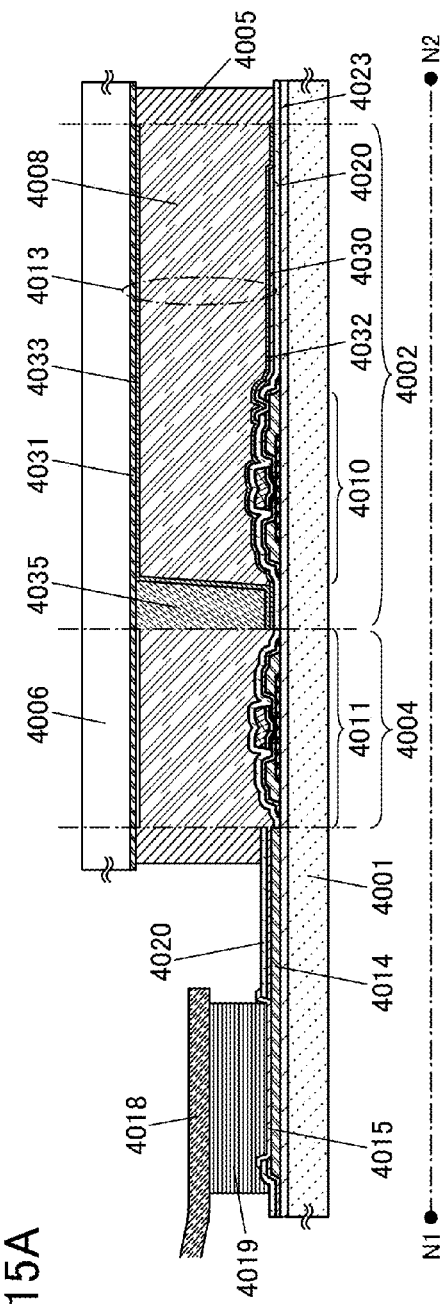
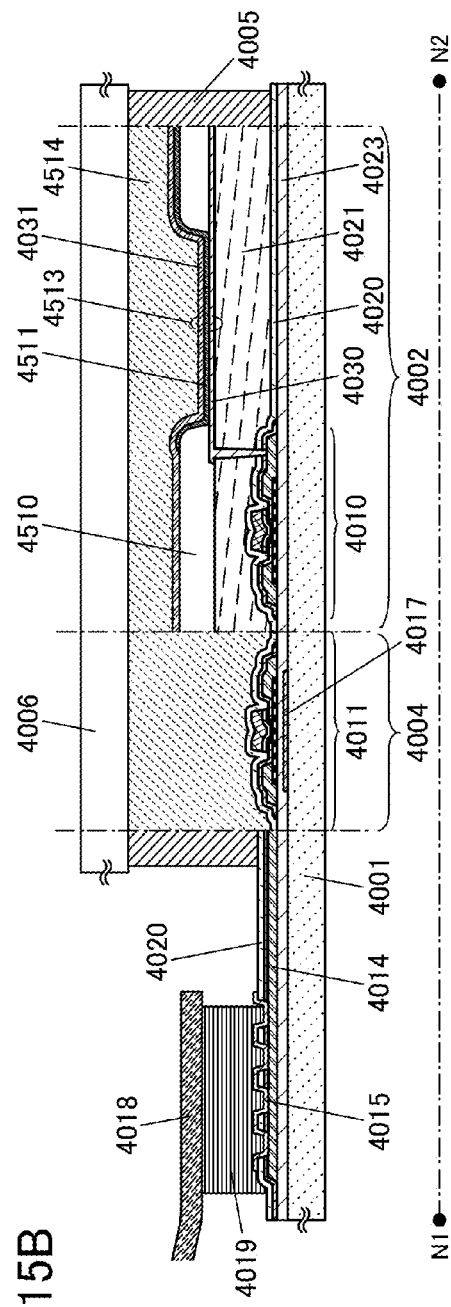
FIG. 15A
FIG. 15B

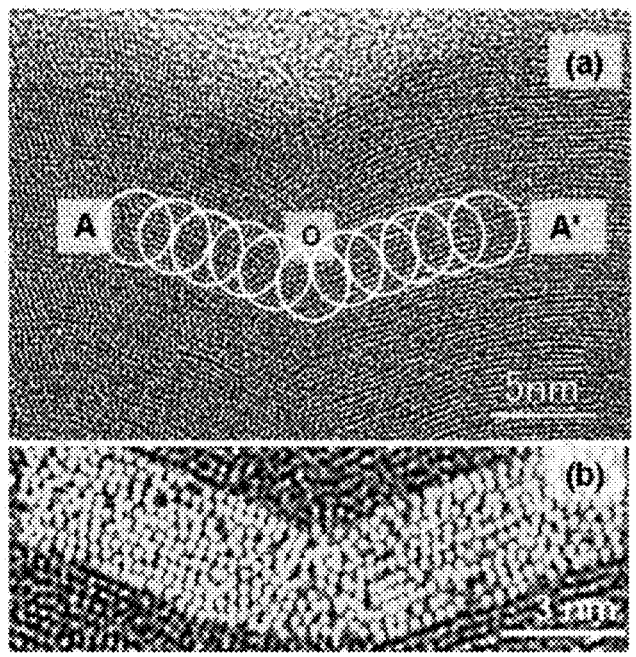
FIG. 18A
FIG. 18B
FIG. 18C
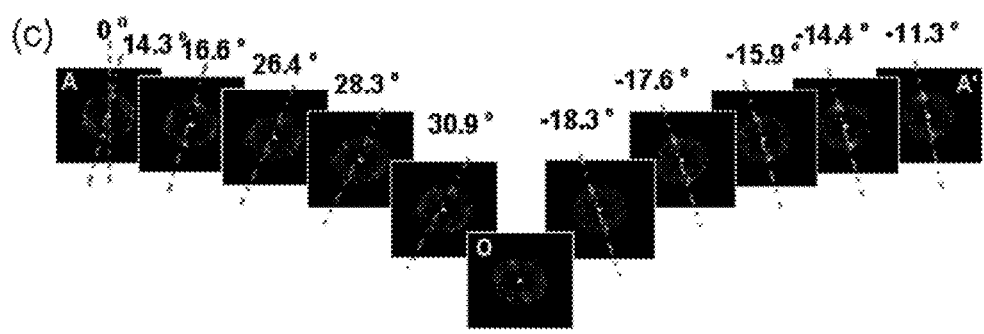

CAAC-OS nc-OS as-sputtered | subjected to the heat treatment at 450 °C

□ proportion of non-CAAC  ▤ proportion of CAAC as-sputtered subjected to the heat treatment at 450 °C

SEMICONDUCTOR DEVICE AND METHOD FOR MANUFACTURING THE SAME

BACKGROUND OF THE INVENTION

1. Field of the Invention

One embodiment of the present invention relates to a semiconductor device and a method for manufacturing the semiconductor device.

Note that in this specification, a semiconductor device generally means a device which can function by utilizing semiconductor characteristics. An electrooptic device, a display device (including a light-emitting display device), a semiconductor circuit, and an electronic device are all semiconductor devices.

2. Description of the Related Art

A technique in which a transistor is formed using a semiconductor thin film has attracted attention. The transistor is applied to a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has been attracting attention.

For example, a technique is disclosed by which a transistor is manufactured using zinc oxide or an In—Ga—Zn-based oxide as an oxide semiconductor (see Patent Documents 1 and 2).

In recent years, demand for an integrated circuit in which transistors and the like are integrated with high density has risen with reductions in the size and weight of an electronic device.

REFERENCE

Patent Documents

[Patent Document 1] Japanese Published Patent Application No. 2007-123861
[Patent Document 2] Japanese Published Patent Application No. 2007-096055

SUMMARY OF THE INVENTION

An object of one embodiment of the present invention is to provide a highly reliable semiconductor device and a method for manufacturing the semiconductor device.

Another object of one embodiment of the present invention is to provide a semiconductor device which is not easily affected by a short channel effect and a method for manufacturing the semiconductor device.

Another object of one embodiment of the present invention is to provide a semiconductor device with favorable electrical characteristics and a method for manufacturing the semiconductor device.

Another object of one embodiment of the present invention is to provide a semiconductor device which can be miniaturized or highly integrated and a method for manufacturing the semiconductor device.

Another object of one embodiment of the present invention is to provide a semiconductor device with small characteristic variation and a method for manufacturing the semiconductor device.

One embodiment of the present invention is a semiconductor device including a first source electrode overlapping a part of a semiconductor layer; a second source electrode extending beyond an end portion of the first source electrode to be in contact with the semiconductor layer; a first drain electrode overlapping another part of the semiconductor layer; a second drain electrode extending beyond an end portion of the first drain electrode to be in contact with the semiconductor layer; a first sidewall in contact with the second source electrode and the semiconductor layer; a second sidewall in contact with the second drain electrode and the semiconductor layer; and a gate electrode overlapping the semiconductor layer, the first sidewall, and the second sidewall with a gate insulating layer provided therebetween.

One embodiment of the present invention is a semiconductor device including a semiconductor layer, a first source electrode, a second source electrode, a first drain electrode, a second drain electrode, a first sidewall, a second sidewall, a gate insulating layer, and a gate electrode. The first source electrode is formed over the semiconductor layer to be in contact with a part of the semiconductor layer. The second source electrode is formed over the first source electrode. A part of the second source electrode extends beyond an end portion of the first source electrode to be in contact with the semiconductor layer. The first drain electrode is formed over the semiconductor layer to be in contact with another part of the semiconductor layer. The second drain electrode is formed over the first drain electrode. A part of the second drain electrode extends beyond an end portion of the first drain electrode to be in contact with the semiconductor layer. The first sidewall is formed in contact with a side surface of the second source electrode and the semiconductor layer. The second sidewall is formed in contact with a side surface of the second drain electrode and the semiconductor layer. The gate electrode is formed over the first sidewall, the second sidewall, and the semiconductor layer with the gate insulating layer provided therebetween.

One embodiment of the present invention is a method for manufacturing a semiconductor device including a gate electrode, a gate insulating layer, a semiconductor layer, a source electrode, a drain electrode, and a sidewall. The method including the steps of forming the source electrode and the drain electrode in contact with the semiconductor layer; forming the sidewall by introducing oxygen to peripheries of the source electrode and the drain electrode; forming the gate insulating layer so that the gate insulating layer overlaps the semiconductor layer and the sidewall; and forming the gate electrode so that the gate electrode overlaps the gate insulating layer.

An oxide semiconductor is preferably used for the semiconductor layer. Further, an oxide semiconductor in which impurities and oxygen vacancy are reduced and which can be regarded as an intrinsic or substantially intrinsic semiconductor is preferably used for the semiconductor layer. Specifically, the carrier density of the oxide semiconductor is lower than $1 \times 10^{17}/cm^3$, lower than $1 \times 10^{15}/cm^3$, or lower than $1 \times 10^{13}/cm^3$.

Further, the semiconductor layer may be a stack including an oxide semiconductor and an oxide layer containing one or more kinds of metal elements contained in the oxide semiconductor.

Further, a thickness t of each of the second source electrode and the second drain electrode is preferably greater than or equal to 5 nm and less than or equal to twice the channel length L.

Further, the thickness of each of the first source electrode and the first drain electrode provided below the second source electrode and the second drain electrode is preferably greater than or equal to the thickness of each of the second source electrode and the second drain electrode.

Alternatively, it is preferable that the sheet resistance of each of the first source electrode and the first drain electrode be less than or equal to that of each of the second source electrode and the second drain electrode.

Further alternatively, it is preferable that the resistivity of each of the first source electrode and the first drain electrode be less than or equal to that of each of the second source electrode and the second drain electrode.

For example, the first sidewall and the second sidewall can be formed in such a manner that an insulating layer is formed over the second source electrode and the second drain electrode and subjected to anisotropic etching.

The first sidewall and the second sidewall can be formed, for example, by introducing oxygen into the peripheries of the second source electrode and the second drain electrode.

A length Lw of the sidewall is preferably greater than or equal to 0.1 nm and less than or equal to 10 nm, further preferably greater than or equal to 0.5 nm and less than or equal to 5 nm, still further preferably greater than or equal to 1 nm and less than or equal to 3 nm. Alternatively, the length Lw of the sidewall is preferably less than or equal to the channel length L, further preferably less than or equal to ⅓ of the channel length L, still further preferably less than or equal to ⅕ of the channel length L.

According to one embodiment of the present invention, a highly reliable semiconductor device and a method of manufacturing the semiconductor device can be provided.

According to one embodiment of the present invention, a semiconductor device which is not easily affected by a short channel effect and a method for manufacturing the semiconductor device can be provided.

According to one embodiment of the present invention, a semiconductor device with favorable electrical characteristics and a method for manufacturing the semiconductor device can be provided.

According to one embodiment of the present invention, a semiconductor device which can be miniaturized or highly integrated and a method for manufacturing the semiconductor device can be provided.

According to one embodiment of the present invention, a semiconductor device with small characteristic variation and a method for manufacturing the semiconductor device can be provided.

BRIEF DESCRIPTION OF THE DRAWINGS

FIGS. 15A and 15B each illustrate an example of a display device.

FIGS. 18A to 18C are cross-sectional TEM images and a local Fourier transform image of an oxide semiconductor.

DETAILED DESCRIPTION OF THE INVENTION

Figure 1A:
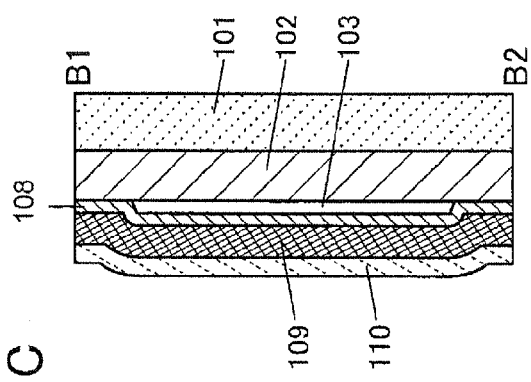
FIGS. 1A to 1D illustrate a structural example of a transistor.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated or omitted for clarifying the invention in some cases. Therefore, embodiments of the present invention are not limited to such a scale.

Note that the position, the size, the range, or the like of each structure illustrated in drawings and the like is not accurately represented in some cases for easy understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding.

Ordinal numbers such as "first" and "second" in this specification and the like are used in order to avoid confusion among components and do not denote the priority or the order such as the order of steps or the stacking order.

Further, functions of the source and the drain might be switched depending on operation conditions, e.g., when a transistor having a different polarity is employed or a direction of current flow is changed in circuit operation.

Therefore, it is difficult to define which is the source (or the drain). Thus, the terms "source" and "drain" can be switched in this specification.

The term "electrically connected" in this specification and the like includes the case where components are connected through an "object having any electric function". There is no particular limitation on an "object having any electric function" as long as electric signals can be transmitted and received between components that are connected through the object. Accordingly, even when the expression "to be electrically connected" is used in this specification, there is a case in which no physical connection is made and a wiring is just extended in an actual circuit.

In addition, in this specification and the like, the term such as "electrode" or "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

(Embodiment 1)

In this embodiment, a transistor 100 is described as an example of a semiconductor device.

<1-1. Structural Example of Semiconductor Device>

Figure 1B:
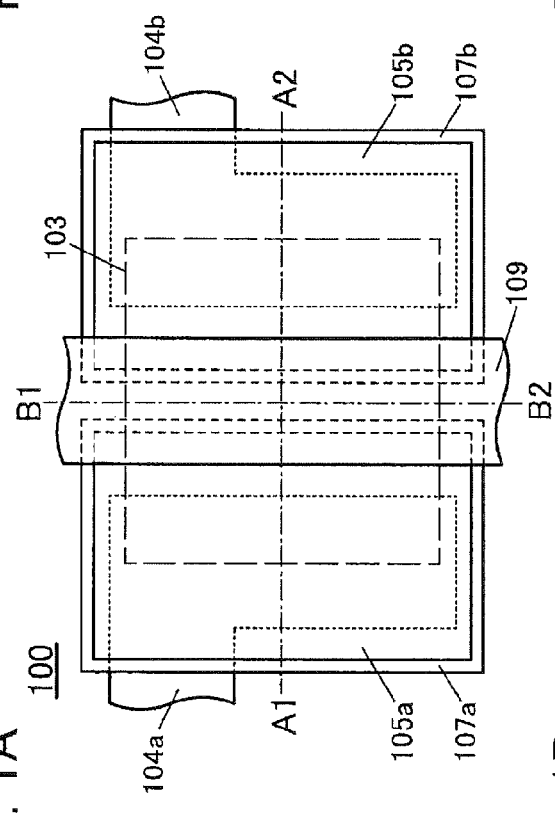
Figure 1C:
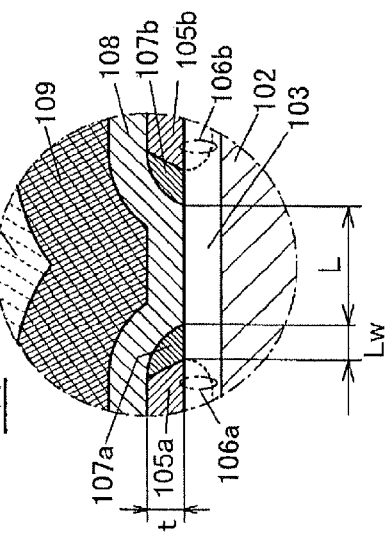
Figure 1D:
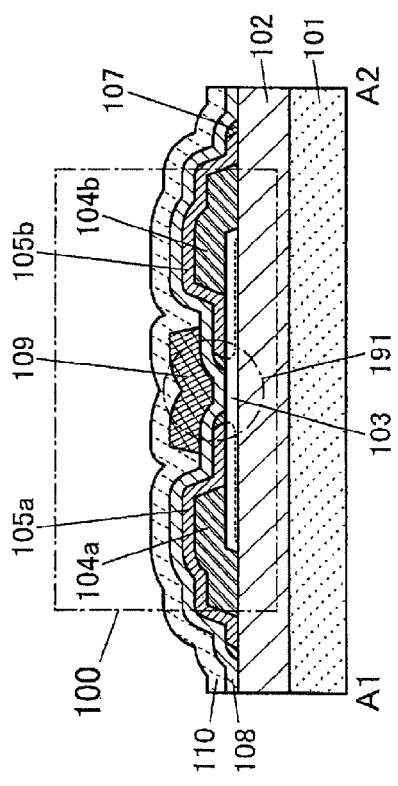

FIGS. 1A to 1D illustrate the transistor 100 of one embodiment of a semiconductor device. The transistor 100 is an example of a top-gate transistor, in which a gate electrode is formed over a semiconductor layer. FIG. 1A is a top view of the transistor 100. FIG. 1B is a cross-sectional view of a portion denoted by a dashed dotted line A1-A2 in FIG. 1A and FIG. 1C is a cross-sectional view of a portion denoted by a dashed dotted line B1-B2 in FIG. 1A. FIG. 1D is an enlarged view of a portion 191 in FIG. 1B.

The transistor 100 illustrated in FIGS. 1A to 1D is formed over a substrate 101 with an insulating layer 102 provided therebetween. Further, the transistor 100 includes a semiconductor layer 103, a first source electrode 104a, a first drain electrode 104b, a second source electrode 105a, a second drain electrode 105b, a first sidewall 107a, a second sidewall 107b, a gate insulating layer 108, and a gate electrode 109. An insulating layer 110 is formed over the transistor 100 in FIGS. 1A to 1D.

Specifically, the semiconductor layer 103 is formed over the insulating layer 102; the first source electrode 104a and the first drain electrode 104b are formed in contact with a part of the semiconductor layer 103; the second source electrode 105a is formed over the first source electrode 104a; and the second drain electrode 105b is formed over the first drain electrode 104b.

A part of the second source electrode 105a extends beyond an end portion of the first source electrode 104a to be in contact with the semiconductor layer 103. A part of the second drain electrode 105b extends beyond the end portion of the first drain electrode 104b to be in contact with the semiconductor layer 103.

The first sidewall 107a is formed at the end portion of the second source electrode 105a, and the second sidewall 107b is formed at the end portion of the second drain electrode 105b. A part of the first sidewall 107a is in contact with the second source electrode 105a, and another part of the first sidewall 107a is in contact with the semiconductor layer 103. A part of the second sidewall 107b is in contact with the second drain electrode 105b and another part of the second sidewall 107b is in contact with the semiconductor layer 103.

The gate insulating layer 108 is formed over the second source electrode 105a, the second drain electrode 105b, the first sidewall 107a, and the second sidewall 107b. The gate electrode 109 overlaps a part of the semiconductor layer 103, a part of the second source electrode 105a, a part of the second drain electrode 105b, a part of the first sidewall 107a, and a part of the second sidewall 107b with the gate insulating layer 108 positioned therebetween. Hereinafter, the first sidewall 107a and the second sidewall 107b are also collectively referred to as a "sidewall 107".

[1-1-1. Substrate]

Although there is no particular limitation on a substrate which can be used as the substrate 101, it is necessary that the substrate have at least heat resistance high enough to withstand heat treatment to be performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate of silicon, silicon carbide, or the like or a compound semiconductor substrate of silicon germanium or the like may be used as the substrate 101. Alternatively, an SOI substrate, a substrate over which a semiconductor element is provided, or the like can be used.

Note that a flexible substrate may also be used as the substrate 101. In the case where a flexible substrate is used, the transistor, the capacitor, or the like may be directly formed over the flexible substrate, or the transistor, the capacitor, or the like may be formed over a manufacturing substrate, and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

The substrate 101 is not limited to a simple supporting substrate, and may be a substrate where a device such as a transistor is formed. In this case, at least one of the gate electrode, the source electrode, and the drain electrode which are included in the transistor 100 may be electrically connected to the above device.

[1-1-2. Base Layer]

The insulating layer 102 functions as a base layer, and can prevent or reduce diffusion of an impurity element from the substrate 101. The insulating layer 102 can be formed with a single layer or a stack of layers using one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, and tantalum oxide. In this specification, a nitride oxide refers to a material containing a larger amount of nitrogen than oxygen, and an oxynitride refers to a material containing a larger amount of oxygen than nitrogen. The content of each element can be measured by Rutherford backscattering spectrometry (RBS), for example.

The insulating layer 102 can be formed by a sputtering method, a molecular beam epitaxy (MBE) method, a chemical vapor deposition (CVD) method, a pulsed laser deposition (PLD) method, an atomic layer deposition (ALD) method, or the like, as appropriate. The hydrogen content of the insulating layer 102 is preferably less than $5\times10^{19}$ cm$^{-3}$, further preferably less than $5\times10^{18}$ cm$^{-3}$.

The insulating layer 102 may be, for example, a multi-layer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose density of a spin corresponding to a signal with a g factor of 2.001 in ESR is less than or equal to $3\times10^{17}$ spins/cm$^3$, preferably less than or equal to $5\times10^{16}$ spins/cm$^3$ is preferably used.

Note that in the case where the semiconductor layer 103 is formed using an oxide semiconductor, at least a region of the insulating layer 102 which is in contact with the semiconductor layer 103 is preferably formed using an insulating layer containing oxygen. For example, in the case where the insulating layer 102 is formed with a stack including a silicon nitride layer and a silicon oxide layer, the semiconductor layer 103 that is an oxide semiconductor is preferably in contact with the silicon oxide layer. As the silicon oxide layer, a silicon oxide layer containing excess oxygen is preferably used. As the silicon nitride layer, a silicon nitride layer from which hydrogen and ammonia are less likely to be released is preferably used. The amount of released hydrogen and ammonia is preferably measured by thermal desorption spectroscopy (TDS) analysis. Further, as the silicon nitride layer, a silicon nitride layer which does not transmit or hardly transmits oxygen is preferably used.

The thickness of the insulating layer 102 may be greater than or equal to 10 nm and less than or equal to 500 nm, preferably greater than or equal to 50 nm and less than or equal to 300 nm.

In this specification and the like, "excess oxygen" refers to oxygen in excess of the stoichiometric composition, for example. Alternatively, excess oxygen refers to oxygen released by heating, for example. Excess oxygen can move inside a film or a layer. Excess oxygen moves between atoms in a film or a layer or excess oxygen replace oxygen that is a constituent of a film or a layer and moves like a billiard ball.

Further, the silicon oxide layer containing excess oxygen refers to a silicon oxide layer from which oxygen can be released by heat treatment or the like. An insulating layer having excess oxygen refers to an insulating layer from which oxygen is released by heat treatment.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis in which heat treatment is performed such that a temperature of a film surface is higher than or equal to 100° C. and lower than or equal to 700° C., preferably higher than or equal to 100° C. and lower than or equal to 500° C. (converted into the number of oxygen atoms).

Here, the method for measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to Formula 1 using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having the mass number of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

[Formula 1]

$$N_{O2} = \frac{N_{H2}}{S_{H2}} \times S_{O2} \times \alpha \quad (1)$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of Formula 1. The amount of released oxygen was measured with a thermal desorption spectroscopy apparatus produced by ESCO Ltd., EMD-WA1000S/W using a silicon wafer containing hydrogen atoms at $1\times10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Further, the film from which oxygen is released by heat treatment may contain a peroxide radical. Specifically, the spin density attributed to the peroxide radical is greater than or equal to $5\times10^{17}$ spins/cm$^3$. Note that the film containing a peroxide radical may have an asymmetric signal with a g factor of approximately 2.01 in ESR.

The insulating layer containing excess oxygen may be formed using oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by RBS.

Note that the insulating layer 102 is not necessarily provided as long as insulation between the substrate 101 and the semiconductor layer 103 to be formed later can be ensured.

[1-1-3. Semiconductor Layer]

An amorphous semiconductor, a microcrystalline semiconductor, a polycrystalline semiconductor, or the like can be used for the semiconductor layer 103. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

The semiconductor layer 103 can be formed by a sputtering method, a molecular beam epitaxy (MBE) method, a CVD method, a pulsed laser deposition method, a laser ablation method, an atomic layer deposition (ALD) method, or the like, as appropriate.

In the case where the semiconductor layer 103 is formed by a sputtering method, a power supply device for generating plasma can be an RF power supply device, an AC power supply device, a DC power supply device, or the like as appropriate.

As a sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas. A gas having a low impurity concentration is used as the sputtering gas. Specifically, a sputtering gas whose dew point is −40° C. or lower, preferably −60° C. or lower is preferably used.

In particular, an oxide semiconductor is preferably used for the semiconductor layer 103. An oxide semiconductor has a band gap of 2 eV or more; therefore, a transistor including an oxide semiconductor in a semiconductor layer has extremely small leakage current (also referred to as an extremely small off-state current) when the transistor is off. Specifically, in a transistor whose channel length is 3 μm and channel width is 10 μm, the off-state current can be lower than $1\times10^{-20}$ A, preferably lower than $1\times10^{-22}$ A, further preferably lower than $1\times10^{-24}$ A. That is, the on/off ratio of the transistor can be greater than or equal to 20 digits and less than or equal to 150 digits.

Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

In the case of using an oxide semiconductor as the semiconductor layer 103, an oxide semiconductor containing one of or both In and Ga is preferably used. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of elements selected from Al, Ti, Ga, Y, Zr, La, Ce, Nd, and Hf). The thickness of the semiconductor layer 103 is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor in which impurities and oxygen vacancy are reduced and which can be regarded as an intrinsic or substantially intrinsic semiconductor is preferably used for the semiconductor layer 103. Specifically, the carrier density of the oxide semiconductor is lower than $1\times10^{17}/cm^3$, lower than $1\times10^{15}/cm^3$, or lower than $1\times10^{13}/cm^3$.

Further, hydrogen and nitrogen easily generate a donor level in an oxide semiconductor, which causes an increase in the carrier density. In particular, when hydrogen is trapped by oxygen vacancy in an oxide semiconductor, a donor level is easily generated. In order to make the oxide semiconductor intrinsic or substantially intrinsic, the concentration of hydrogen in the oxide semiconductor, which is measured by SIMS, is set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor, which is measured by SIMS, is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Particularly when silicon is contained in the oxide semiconductor at a high concentration, an impurity level due to silicon is formed in the oxide semiconductor. In some cases, the impurity level becomes a trap, which degrades electrical characteristics of the transistor. In order to make the deterioration of the electrical characteristics of the transistor small, the concentration of silicon in the oxide semiconductor layer 103, which is formed using an oxide semiconductor, is set to lower than $1\times10^{19}$ atoms/cm$^3$, preferably lower than $5\times10^{18}$ atoms/cm$^3$, further preferably lower than $1\times10^{18}$ atoms/cm$^3$.

In addition, in a case where the oxide semiconductor includes a crystal, the crystallinity of the oxide semiconductor might be decreased if silicon or carbon is included at high concentration. In order not to lower the crystallinity of the oxide semiconductor, the concentration of silicon in the oxide semiconductor can be set to lower than $1\times10^{19}$ atoms/cm$^3$, preferably lower than $5\times10^{18}$ atoms/cm$^3$, further preferably lower than $1\times10^{18}$ atoms/cm$^3$. Moreover, the concentration of carbon can be set to be lower than $1\times10^{19}$ atoms/cm$^3$, preferably lower than $5\times10^{18}$ atoms/cm$^3$, further preferably lower than $1\times10^{18}$ atoms/cm$^3$.

When the channel formation region is formed using the highly purified oxide semiconductor layer, the off-state current of the transistor can be extremely low.

[1-1-3-1. Structure of Oxide Semiconductor Film]

Here, a structure of an oxide semiconductor film is described. An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

FIG. 18A is a cross-sectional TEM image of a CAAC-OS film. FIG. 18B is a cross-sectional TEM image obtained by enlarging the image of FIG. 18A. In FIG. 18B, atomic arrangement is highlighted for easy understanding.

FIG. 18C is Fourier transform images of regions each surrounded by a circle (the diameter is about 4 nm) between A and O and between O and A' in FIG. 18A. C-axis alignment can be observed in each region in FIG. 18C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 19A).

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. The polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 19B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (a small amount of oxygen vacancy). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 19A:
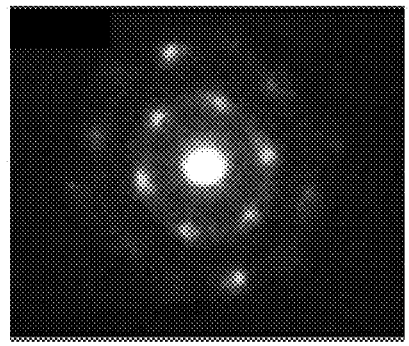
FIGS. 19A and 19B show nanobeam electron diffraction patterns of oxide semiconductor films and FIGS. 19C and 19D illustrate an example of a transmission electron diffraction measurement apparatus.
Figure 19B:
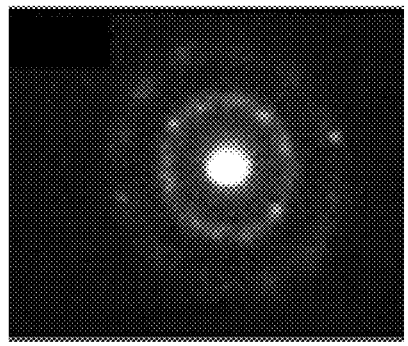
Figure 19C:
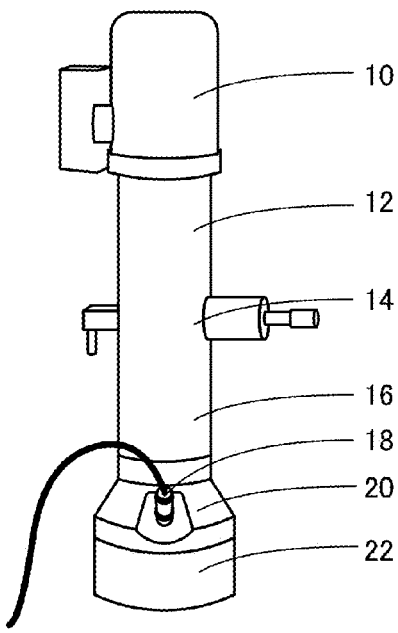

FIG. 19C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 19D:
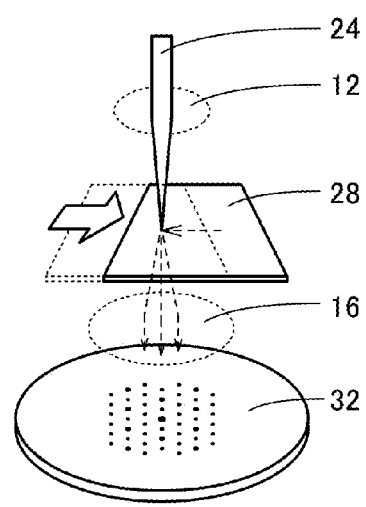

FIG. 19D illustrates an internal structure of the transmission electron diffraction measurement apparatus illustrated in FIG. 19C. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of entered electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above is described.

For example, changes in the structure of a substance can be observed by changing (scanning) the irradiation position of the electrons 24 that are a nanobeam in the substance, as illustrated in FIG. 19D. At this time, when the substance 28 is a CAAC-OS film, a diffraction pattern as shown in FIG. 19A is observed. When the substance 28 is an nc-OS film, a diffraction pattern shown in FIG. 19B is observed.

Even when the substance 28 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a region where a diffraction pattern different from that of a CAAC-OS film is observed is referred to as the proportion of not-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 20A:
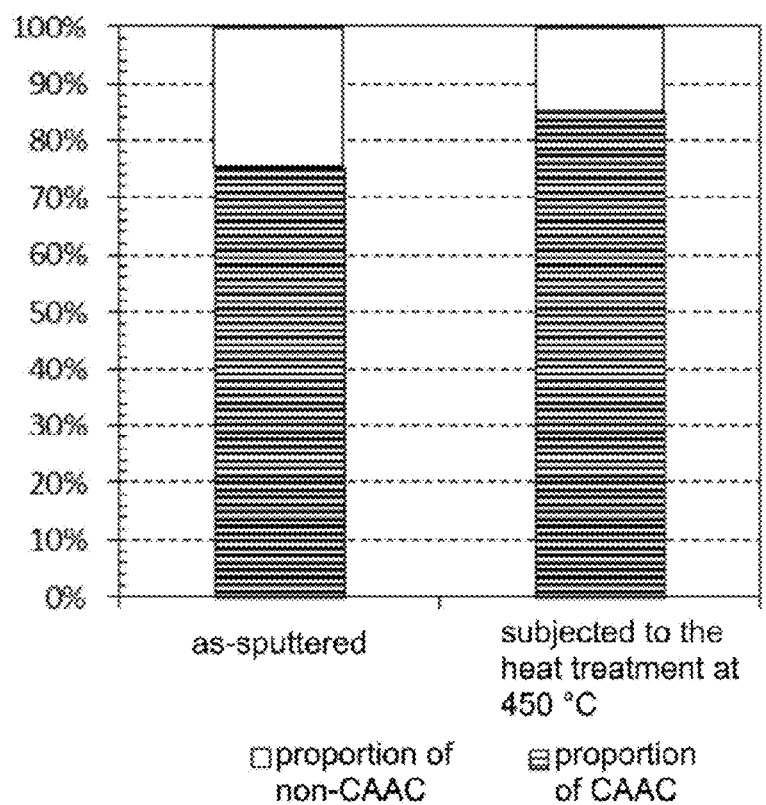
FIG. 20A shows an example of structural analysis by transmission electron diffraction measurement and FIGS. 20B and 20C show planar TEM images.

FIG. 20A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Further, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 20B:
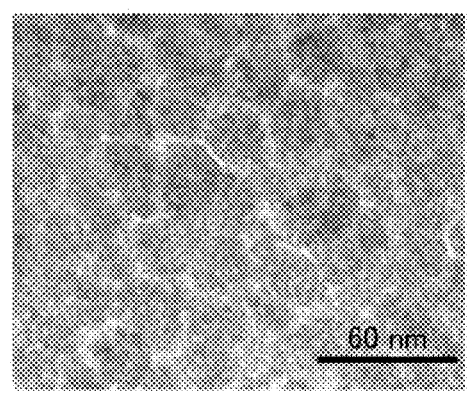
Figure 20C:
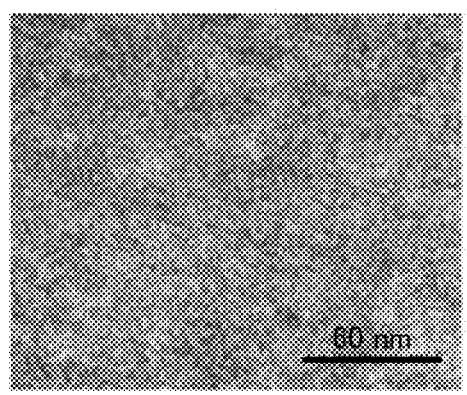

FIGS. 20B and 20C are planar TEM images of the CAAC-OS film obtained just after the deposition and the CAAC-OS film subjected to the heat treatment at 450° C., respectively. Comparison between FIGS. 20B and 20C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as carrier traps or serves as a carrier generation source when hydrogen is captured therein.

The state in which impurity concentration is low and density of defect states is low (the amount of oxygen vacancy is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has small variation in electrical characteristics and high reliability. Charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. The polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction area) of the nc-OS film obtained by using an electron beam having a probe diameter (e.g., larger than or equal to 50 nm) larger than that of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is observed in an electron diffraction pattern of the amorphous oxide semiconductor layer. Further, a halo pattern is observed but a spot is not shown observed a nanobeam electron diffraction pattern of the amorphous oxide semiconductor layer.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (a small amount of oxygen vacancy). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more kinds of an amorphous oxide semiconductor film, a microcrystalline oxide semiconductor film, and a CAAC-OS film, for example.

[1-1-4. First Source Electrode and First Drain Electrode]

The first source electrode 104a and the first drain electrode 104b are formed over the semiconductor layer 103 to be in contact with part of the semiconductor layer 103. For a conductive material for forming the first source electrode 104a and the first drain electrode 104b, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; titanium nitride; titanium nitride; or the like can be used. A semiconductor typified by polycrystalline silicon including an impurity element such as phosphorus, or silicide such as nickel silicide may also be used. There is no particular limitation on a formation method of the conductive layer, and a variety of formation methods such as an evaporation method, a CVD method, a sputtering method, and a spin coating method can be employed.

The first source electrode 104a and the first drain electrode 104b can also be formed using a conductive material containing oxygen, such as indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above conductive material containing oxygen and a material containing the above metal element.

The first source electrode 104a and the first drain electrode 104b may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer which contains aluminum and one or more elements selected from titanium, tantalum, tungsten, molybdenum, chromium, neodymium, and scandium may be used.

In the case where a semiconductor material such as silicon or germanium is used for the semiconductor layer 103, it is preferable that an n-type semiconductor layer or a p-type semiconductor layer be formed between the semiconductor layer 103 and each of the first source electrode 104a and the first drain electrode 104b. Alternatively, it is preferable that $n^+$ impurity regions or $p^+$ impurity regions be formed by introducing an impurity element into regions of the semiconductor layer 103 over which the source and drain electrodes are positioned by a known method. When the impurity semiconductor layer or the impurity region is formed between the semiconductor layer and the electrodes, favorable ohmic contact between the semiconductor layer and the electrodes can be obtained.

In the case where an oxide semiconductor material is used for the semiconductor layer 103, a material which is capable of extracting oxygen from a part of the semiconductor layer 103 to generate oxygen vacancy is preferably used for at least parts of the first source electrode 104a and the first drain electrode 104b that are in contact with the semiconductor layer 103. The carrier concentration of the regions of the semiconductor layer 103 in which oxygen vacancy is generated is increased, so that the regions become n-type regions ($n^+$ layers). Accordingly, the regions can function as a source region 106a and a drain region 106b. Examples of the material which is capable of removing oxygen from the semiconductor layer 103 and the oxide layer to cause oxygen vacancy include tungsten and titanium. When an oxide semiconductor material is used for the semiconductor layer 103, a more favorable ohmic contact can be formed between the semiconductor layer and the electrodes without formation of the impurity layer or the impurity region. Accordingly, the productivity of a semiconductor device can be improved.

Formation of the source region 106a and the drain region 106b in the semiconductor layer 103 makes it possible to reduce contact resistance between the semiconductor layer 103 and each of the first source electrode 104a and the first drain electrode 104b. Accordingly, the electrical characteristics of the transistor, such as the field-effect mobility and the threshold voltage variation, can be favorable.

Note that the first source electrode 104a and the first drain electrode 104b each preferably have a thickness of greater than or equal to 10 nm and less than or equal to 500 nm, further preferably greater than or equal to 50 nm and less than or equal to 300 nm.

It is preferable that the thickness t of each of the second source electrode 105a and the second drain electrode 105b be less than or equal to twice the channel length L of the transistor although the detail is described later. However, when the thickness t of each of the second source electrode 105a and the second drain electrode 105b is less than or equal to twice the channel length L of the transistor, the probability of an increase in resistance values thereof is increased.

Accordingly, the thickness of each of the first source electrode 104a and the first drain electrode 104b provided below the second source electrode 105a and the second drain electrode 105b is preferably greater than or equal to the thickness of each of the second source electrode 105a and the second drain electrode 105b.

Alternatively, it is preferable that the sheet resistance of each of the first source electrode 104a and the first drain electrode 104b be less than or equal to that of each of the second source electrode 105a and the second drain electrode 105b.

Further alternatively, it is preferable that the resistivity of each of the first source electrode 104a and the first drain electrode 104b be less than or equal to that of each of the second source electrode 105a and the second drain electrode 105b.

[1-1-5. Second Source Electrode and Second Drain Electrode]

The second source electrode 105a and the second drain electrode 105b, which overlap the first source electrode 104a and the first drain electrode 104b, respectively, can be formed using a material and a method similar to those of the first source electrode 104a and the first drain electrode 104b.

The part of the second source electrode 105a extends beyond the end portion of the first source electrode 104a to be in contact with the semiconductor layer 103. The part of the second drain electrode 105b extends beyond the end portion of the first drain electrode 104b to be in contact with the semiconductor layer 103.

The thickness t of a conductive layer for forming the second source electrode 105a and the second drain electrode 105b is preferably less than or equal to twice the channel length L, further preferably less than or equal to the channel length L. The thickness t of the conductive layer for forming the second source electrode 105a and the second drain electrode 105b is determined using the channel L as a standard, whereby variation in the shapes of the second source electrode 105a and the second drain electrode 105b can be reduced. Further, it becomes possible to form the second source electrode 105a and the second drain electrode 105b with high processing accuracy, so that variation in the channel length L can be reduced. Therefore, electrical characteristic variation of the transistor can be reduced, and thus a semiconductor device with small characteristic variation can be provided.

However, the too small thickness t of each of the second source electrode 105a and the second drain electrode 105b causes an increase in the resistivity of the second source electrode 105a and the second drain electrode 105b, which reduces the on-state current and the field-effect mobility of the transistor. Accordingly, it is preferable that the thickness t of each of the second source electrode 105a and the second drain electrode 105b be greater than or equal to 5 nm.

Specifically, in the case where the channel length L of the transistor is set to 50 nm, the thickness t of each of the second source electrode 105a and the second drain electrode 105b is preferably greater than or equal to 5 nm and less than or equal to 100 nm In the case where the channel length L of the transistor is set to 30 nm, the thickness t of each of the second source electrode 105a and the second drain electrode 105b is preferably greater than or equal to 5 nm and less than or equal to 60 nm.

[1-1-6. Sidewall]

The sidewall 107 is preferably formed using an insulating material containing oxygen. Specifically, the sidewall 107 can be formed using a material similar to the gate insulating layer 108 described later. Alternatively, the sidewall 107 may be formed using a metal oxide material which contains one or more kinds of metal elements contained in the semiconductor layer 103. Forming the sidewall 107 using such a material can reduce defects generated at the interface between the sidewall 107 and the semiconductor layer 103. A specific method for forming the sidewall 107 is described later.

A length Lw of the sidewall 107 (see FIG. 1D) is preferably greater than or equal to 0.1 nm and less than or equal to 10 nm, further preferably greater than or equal to 0.5 nm and less than or equal to 5 nm, still further preferably greater than or equal to 1 nm and less than or equal to 3 nm. Alternatively, the length Lw of the sidewall 107 (see FIG. 1D) is preferably less than or equal to the channel length L, further preferably less than or equal to 1/3 of the channel length L, still further preferably less than or equal to 1/5 of the channel length L.

[1-1-7. Gate Insulating Layer]

The gate insulating layer 108 is formed with a single layer or a stack of layers using any of materials containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The thickness of the gate insulating layer 108 is greater than or equal to 1 nm and less than or equal to 100 nm, preferably greater than or equal to 10 nm and less than or equal to 50 nm. The gate insulating layer 108 can be formed by a sputtering method, a CVD method, an MBE method, an ALD method, or a PLD method.

The gate insulating layer 108 may be, for example, a multilayer film including a silicon nitride as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is less than or equal to $3\times10^{17}$ spins/cm$^3$, preferably less than or equal to $5\times10^{16}$ spins/cm$^3$ is used. As the silicon oxide layer, a silicon oxide layer containing excess oxygen is preferably used. As the silicon nitride layer, a silicon nitride layer from which hydrogen and ammonia are less likely to be released is used. The amount of released hydrogen or ammonia may be measured by TDS.

Note that when the gate insulating layer 108 is thin, gate leakage due to a tunneling effect or the like might becomes a problem. In order to solve the problem of gate leakage, the above high-k material is preferably used for the gate insulating layer 108. By using a high-k material for the gate insulating layer 108, the thickness thereof can be increased for suppression of gate leakage with favorable electric characteristics of the gate insulating layer maintained. Note that a stacked-layer structure of a layer containing a high-k material and a layer containing any of silicon oxide, silicon nitride, silicon oxynitride, silicon nitride oxide, aluminum oxide, or the like may be employed.

[1-1-8. Gate Electrode]

For a conductive material for forming the gate electrode 109, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The gate electrode 109 can be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above conductive material containing oxygen and a material containing the above metal element.

Further, the gate electrode 109 may have a single-layer structure or a stacked-layer of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer which contains aluminum and one or more elements selected from titanium, tantalum, tungsten, molybdenum, chromium, neodymium, and scandium may be used.

Further, an In—Ga—Zn-based oxynitride semiconductor layer, an In—Sn-based oxynitride semiconductor layer, an In—Ga-based oxynitride semiconductor layer, an In—Zn-based oxynitride semiconductor layer, a Sn-based oxynitride semiconductor layer, an In-based oxynitride semiconductor layer, a layer of metal nitride (such as InN or ZnN), or the like may be provided between the gate electrode 109 and the gate insulating layer 108. These layers each have a work function of 5 eV or higher and the electron affinity of each of these layers is larger than that of an oxide semiconductor; thus, the threshold voltage of the transistor including an oxide semiconductor in a semiconductor layer in which a channel is formed can be shifted in a positive direction. Accordingly, what is called a normally-off switching element can be obtained. For example, in the case where an In—Ga—Zn-based oxynitride semiconductor layer is provided between the gate electrode 109 and the gate insulating layer 108, an In—Ga—Zn-based oxynitride semiconductor layer having a higher nitrogen concentration than at least the semiconductor layer 103, specifically, an In—Ga—Zn-based oxynitride semiconductor film having a nitrogen concentration of 7 at. % or higher is used.

Note that the thickness of the gate electrode 109 may be greater than or equal to 10 nm and less than or equal to 500 nm, preferably greater than or equal to 50 nm and less than or equal to 300 nm.

[1-1-9. Protective Insulating Layer]

The insulating layer 110 functions as a protective insulating layer, and can prevent or reduce diffusion of an impurity element from the outside. The insulating layer 110 can be formed using a material and a method similar to those of the insulating layer 102. The insulating layer 110 may be, for example, a multilayer film including a silicon oxide layer as a first layer and a silicon nitride layer as a second layer. The silicon oxide layer may be a silicon oxide layer containing excess oxygen.

In the case where at least one of the insulating layer 102, the gate insulating layer 108, and the insulating layer 110 includes an insulating layer containing excess oxygen, oxygen vacancies of the semiconductor layer 103 can be reduced owing to the excess oxygen.

Note that the thickness of the insulating layer 110 may be greater than or equal to 10 nm and less than or equal to 300 nm, preferably greater than or equal to 30 nm and less than or equal to 200 nm.

[1-1-10. Channel Formation Region]

When a voltage is applied to the gate electrode 109, an electric field with an intensity corresponding to the voltage is applied to the semiconductor layer 103 through the gate insulating layer 108, so that a channel is formed in the semiconductor layer 103. The voltage of the gate electrode 109 at which the channel is formed in the semiconductor layer 103 is referred to as a "threshold voltage". In the case where the transistor 100 is an n-channel transistor, when the potential of the first source electrode 104a (the second source electrode 105a) is set to 0 V and a voltage higher than or equal to the threshold voltage is applied to the gate electrode 109, the channel is formed in the semiconductor layer 103. The second source electrode 105a is electrically connected to the second drain electrode 105b through the channel formed in the semiconductor layer 103. In general, a region of the semiconductor layer 103 where the channel is formed is referred to as a "channel formation region".

Note that a shortest distance between the end portions of the first sidewall 107a and the second sidewall 107b which face each other and are in contact with the semiconductor layer 103 and over which the gate electrode 109 is positioned is referred to as the channel length L (see FIG. 1D).

In the transistor 100 of one embodiment of the present invention, the sidewall 107 is formed at the end portions of the second source electrode 105a and the second drain electrode 105b. An electric field is applied to regions of the channel formation region in the vicinities of the end portions of the second source electrode 105a and the second drain electrode 105b through the gate insulating layer 108 and the sidewall 107.

Accordingly, the electric field applied to the channel formation region in the vicinities of the end portions of the second source electrode 105a and the second drain electrode 105b is weaker than that applied to the center of the channel formation region owing to the thickness of the sidewall 107. That is, the sidewall 107 can relieve the electric field in the vicinity of the source electrode or the drain electrode; therefore, hot-carrier degradation of the transistor is unlikely to occur. Therefore, reliability of the transistor can be improved. Thus, reliability of a semiconductor device including the transistor can be improved.

A short channel effect is also unlikely to occur in a transistor with a channel length of 50 nm or less; therefore, favorable electrical characteristics of the transistor can be obtained. According to one embodiment of the present invention, even when the channel length is less than or equal to 30 nm, the transistor with favorable electrical characteristics can be obtained. Therefore, a semiconductor device with favorable characteristics can be obtained with the use of the transistor.

<1-2. Example of Method for Manufacturing Semiconductor Device>

An example of a method for manufacturing the transistor 100 is described using cross-sectional views illustrated in FIGS. 2A to 2D and FIGS. 3A to 3D, as an example of a method for manufacturing a semiconductor device.

[1-2-1. Formation of Base Layer]

Figure 2A:
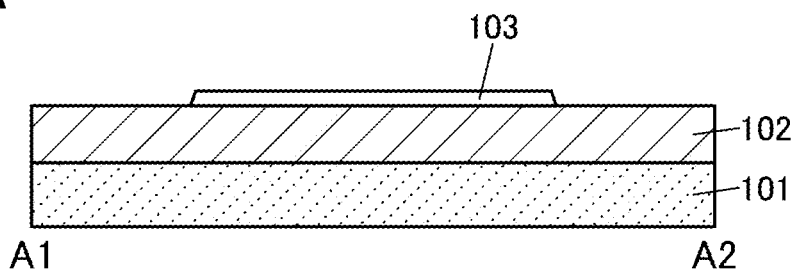
FIGS. 2A to 2D illustrate an example of a method for manufacturing a transistor.
Figure 2B:
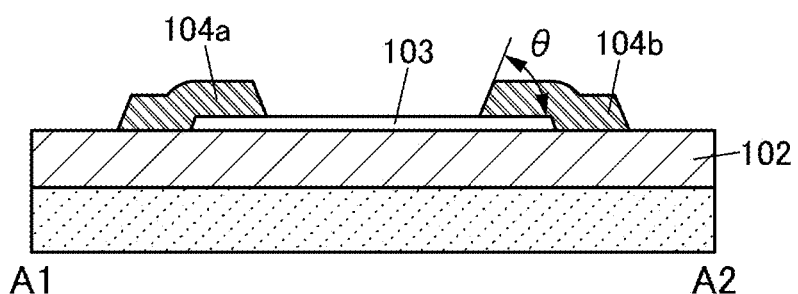
Figure 2C:
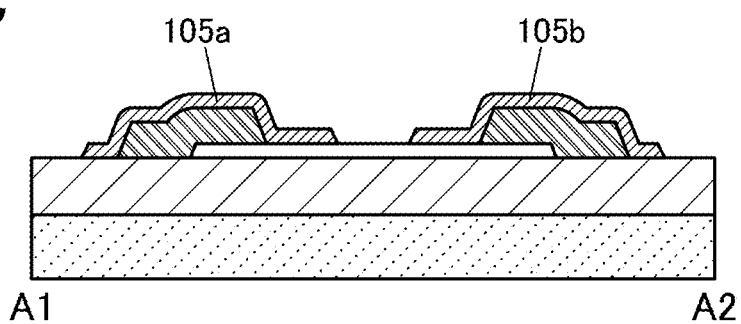

The insulating layer 102 serving as a base layer is formed over the substrate 101 (see FIG. 2A). For example, a glass substrate is used as the substrate 101. Next, an example in which the insulating layer 102 has a stacked-layer structure of a silicon nitride layer, a first silicon oxide layer, and a second silicon oxide layer is described.

First, a silicon nitride layer is formed over the substrate 101. The silicon nitride layer is preferably formed by a plasma CVD method, which is a kind of CVD method. Specifically, the silicon nitride layer may be formed by supplying high-frequency power under the following conditions: the substrate temperature is higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of the ammonia gas facilitates decomposition of the deposition gas containing silicon and the nitrogen gas. This is because an ammonia gas is dissociated by plasma energy or heat energy, and energy generated by the dissociation contributes to decomposition of a molecular bond of the deposition gas containing silicon and a molecular bond of the nitrogen gas.

Through the above method, the silicon nitride layer from which the hydrogen gas and the ammonia gas are less likely to be released can be formed. Further, owing to the low hydrogen content, a dense silicon nitride layer through which hydrogen, water, and oxygen do not permeate or hardly permeate can be formed.

Next, a first silicon oxide layer is formed. The first silicon oxide layer is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode under the following conditions: the substrate temperature is set to be higher than or equal to 160° C. and lower than or equal to 350° C., preferably higher than or equal to 180° C. and lower than or equal to 260° C.; a deposition gas containing silicon and an oxidation gas are used; and the pressure is set to be higher than or equal to 100 Pa and lower than or equal to 250 Pa, preferably higher than or equal to 100 Pa and lower than or equal to 200 Pa.

According to the above-described method, the gas decomposition efficiency in plasma is enhanced, oxygen radicals are increased, and oxidation of the gas is promoted; as a result, the first silicon oxide layer can contain excess oxygen.

Then, a second silicon oxide layer is formed. The second silicon oxide layer is preferably formed by a plasma CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon and an oxidation gas are used; and the pressure is set to be higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidation gas include oxygen, ozone, nitrous oxide, and nitrogen dioxide.

Note that when the flow rate of the oxidation gas is 100 times as high as that of the deposition gas containing silicon, the hydrogen content and dangling bonds in the second silicon oxide layer can be reduced.

In such a manner, the second silicon oxide layer whose defect density is lower than the first silicon oxide layer is formed. In other words, the second silicon oxide layer can have a density of a spin corresponding to a signal with a g factor of 2.001 in ESR less than or equal to $3\times10^{17}$ spins/cm$^3$, or less than or equal to $5\times10^{16}$ spins/cm$^3$.

After the silicon nitride layer is formed, treatment for adding oxygen to the silicon nitride layer may be performed. Further, after the first silicon oxide layer is formed, treatment for adding oxygen to the first silicon oxide layer may be performed. Furthermore, after the second silicon oxide layer is formed, treatment for adding oxygen to the second silicon oxide layer may be performed. The treatment for adding oxygen can be performed by heat treatment under an oxygen atmosphere or performed with an ion implantation apparatus, an ion doping apparatus, or a plasma treatment apparatus. As the ion doping apparatus, an ion doping apparatus with a mass separation function may be used. As a gas for adding oxygen, an oxygen gas of $^{16}O_2$, $^{18}O_2$, or the like, a nitrous oxide gas, an ozone gas, or the like can be used.

[1-2-2. Formation of Semiconductor Layer]

In this embodiment, the case where the semiconductor layer 103 is formed using an oxide semiconductor is described.

First, an oxide semiconductor film for forming the semiconductor layer 103 is formed over the insulating layer 102 by a sputtering method. Then, a 15-nm-thick In—Ga—Zn oxide is formed as the oxide semiconductor film using a target having an atomic ratio of In:Ga:Zn=1:1:1. Note that heating during the formation of the oxide semiconductor film may be performed at a substrate temperature of higher than or equal to 100° C. and lower than or equal to 500° C., preferably higher than or equal to 170° C. and lower than or equal to 350° C.

A CAAC-OS film is preferably used as the oxide semiconductor film for forming the semiconductor layer 103. Four examples of a method for forming a CAAC-OS film are described.

The first method is to form an oxide semiconductor film at a temperature higher than or equal to 100° C. and lower than or equal to 500° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

The fourth method is to form an oxide semiconductor which includes crystal parts in which the c-axes are aligned in a direction parallel to a normal vector of a surface on which the oxide semiconductor is formed or a normal vector of a surface of the oxide semiconductor, with the use of a target including a polycrystalline oxide semiconductor with high alignment.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of the impurities in a sputtering gas may be reduced. Specifically, a sputtering gas whose dew point is −40° C. or lower, preferably −60° C. or lower is used.

By increasing the heating temperature of the surface where the CAAC-OS film is formed (for example, the substrate heating temperature) during the deposition, migration of a sputtered particle is likely to occur after the sputtered particle reaches the surface where the CAAC-OS film is formed. Specifically, the temperature of the surface where the CAAC-OS film is formed during the deposition is higher than or equal to 100° C. and lower than or equal to 740° C., preferably higher than or equal to 150° C. and lower than or equal to 500° C.

Further, it is preferable that the proportion of oxygen in the sputtering gas be increased and the power be optimized in order to reduce plasma damage at the time of deposition. The proportion of oxygen in the sputtering gas is higher than or equal to 30 vol % and lower than or equal to 100 vol %.

As an example of the sputtering target, an In—Ga—Zn-based metal oxide target is described below.

The polycrystalline In—Ga—Zn-based metal oxide target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 5:5:6, 4:2:3, or 3:1:2. The kinds of powder and the molar ratio for mixing powder may be determined as appropriate depending on a desired sputtering target.

An oxide semiconductor film which is formed by a sputtering method contains hydrogen, water, a compound having a hydroxyl group, or the like in some cases. Hydrogen, water, and the like easily form a donor level and thus serve as impurities in the oxide semiconductor film. Therefore, in the formation of the oxide semiconductor film by a sputtering method, the hydrogen concentration in the oxide semiconductor film is preferably reduced as much as possible.

The leakage rate of a treatment chamber of a sputtering apparatus is set to $1 \times 10^{-10}$ Pa·m$^3$/s or less in the formation of the oxide semiconductor film, whereby entry of impurities such as an alkali metal and hydride into the oxide semiconductor film that is being deposited by a sputtering method can be reduced. Further, with the use of an entrapment vacuum pump (e.g., a cryopump) as an evacuation system, counter flow of impurities such as an alkali metal, a hydrogen atom, a hydrogen molecule, water, a compound having a hydroxyl group, and hydride from the evacuation system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium in the oxide semiconductor film can be reduced. The silicon concentration of the target is preferably lower than or equal to $1 \times 10^{18}$ atoms/cm$^3$.

In order that impurities such as moisture and hydrogen in the oxide semiconductor film are further reduced (dehydration or dehydrogenation are performed) to highly purify the oxide semiconductor film, the oxide semiconductor film is preferably subjected to heat treatment. For example, the semiconductor layer 103 may be subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

In the case where the heat treatment is performed, the heat treatment may be performed at a temperature higher than or equal to 250° C. and lower than or equal to 650° C., preferably higher than or equal to 300° C. and lower than or equal to 500° C. The treatment time is 3 minutes to 24 hours. Heat treatment for over 24 hours is not preferable because the productivity is reduced.

There is no particular limitation on a heat treatment apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

By the heat treatment, hydrogen (water, a compound having a hydroxyl group) can be released from the oxide semiconductor film. Thus, the impurities in the oxide semiconductor film can be reduced, so that the oxide semiconductor film can be highly purified. Further, in particular, hydrogen serving as an unstable carrier source can be detached from the oxide semiconductor film; therefore, the negative shift of the threshold voltage of the transistor can be prevented. As a result, the reliability of the transistor can be improved.

By heat treatment performed in an atmosphere containing an oxidation gas, oxygen vacancy in the oxide semiconductor film can be reduced at the same time as the release of the impurities. Alternatively, the heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate desorbed oxygen.

After the oxide semiconductor film is formed by a sputtering method, a resist mask is formed over the oxide semiconductor film and the oxide semiconductor film is etched into a desired shape using the resist mask, so that the island-shape semiconductor layer 103 is formed (see FIG. 2A). The resist mask can be formed by a photolithography method, a printing method, an inkjet method, or the like as appropriate. Formation of the resist mask by an inkjet method needs no photomask; thus, manufacturing cost can be reduced.

Note that the etching of the oxide semiconductor film may be performed by either one or both of a dry etching method and a wet etching method. In the case where the oxide semiconductor film is etched by a wet etching method, a solution obtained by mixing phosphoric acid, acetic acid, and nitric acid, a solution containing oxalic acid, a solution containing phosphoric acid, or the like can be used as the etchant. Alternatively, ITO-07N (produced by Kanto Chemical Co., Inc.) may be used.

A chlorine-based gas typified by chlorine ($Cl_2$), boron trichloride ($BCl_3$), silicon tetrachloride ($SiCl_4$), carbon tetrachloride ($CCl_4$), or the like can be used as an etching as for the dry etching of the oxide semiconductor film. As a plasma source in the case where the etching of the oxide semiconductor film is performed by a dry etching method, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

To etch the oxide semiconductor film, dry etching treatment is performed using chlorine ($Cl_2$) and boron trichloride ($BCl_3$) as an etching gas in this embodiment. Note that part of the insulating layer 102 over which the island-shaped semiconductor layer 103 is not provided might be etched depending on the etching conditions.

Note that when the end portion of the island-shaped semiconductor layer 103 has a tapered shape, coverage with a layer covering the island-shaped semiconductor layer 103 can be improved. Specifically, the end portion has a taper angle θ of 80° or less, preferably 60° or less, further preferably 45° or less. Note that the "taper angle" refers to an inclination angle formed by a side surface and a bottom surface of a layer having a taper shape when the layer is seen from the direction perpendicular to the cross section of the layer (i.e., the plane perpendicular to the surface of the substrate). A taper angle smaller than 90° is called forward tapered angle and a taper angle of larger than or equal to 90° is called inverse tapered angle.

After the etching treatment, the resist mask is removed. In this manner, the semiconductor layer 103 can be formed (see FIG. 2A). Note that the heat treatment may be performed after formation of the semiconductor layer 103.

[1-2-3. Formation of First Source Electrode and First Drain Electrode]

Next, to form the first source electrode 104a and the first drain electrode 104b (including other electrodes and wirings formed using the same layer), a conductive film is formed over the semiconductor layer 103 and the insulating layer 102. In this embodiment, as the conductive layer, a 30-nm-thick tungsten is formed by a sputtering method.

Next, a resist mask is formed over the conductive layer. The resist mask can be formed by a photolithography method, a printing method, an inkjet method, or the like as appropriate. Formation of the resist mask by an inkjet method needs no photomask; thus, manufacturing cost can be reduced. Here, the conductive layer is formed of tungsten by a sputtering method.

Then, part of the conductive layer is selectively etched using the resist mask, so that the first source electrode 104a and the first drain electrode 104b (including other electrodes and wirings formed using the same layer) are formed. The etching of the conductive layer may be performed by a dry etching method, a wet etching method, or both a dry etching method and a wet etching method. After that, the resist mask is removed (see FIG. 2B).

It is preferable that the first source electrode 104a and the first drain electrode 104b (including other electrodes and wirings formed using the same layer) each have an end portion having a tapered shaped. Specifically, the end portion has a taper angle θ of 80° or less, preferably 60° or less, further preferably 45° or less.

When the cross-section of each of the end portions of the first source electrode 104a and the first drain electrode 104b (including other electrodes and wirings formed using the same layer) has a step-like shape including a plurality of steps, the coverage of a layer covering the first source electrode 104a and the first drain electrode 104b can be improved. The above is not limited to the first source electrode 104a and the first drain electrode 104b, and by providing a forward taper shape or a step-like shape for a cross section of the end portion of each layer, a phenomenon in that a layer formed to cover the end portion is separated (disconnection) at the end portion can be prevented, so that the coverage becomes favorable.

[1-2-4. Formation of Second Source Electrode and Second Drain Electrode]

Next, as a conductive layer for forming the second source electrode 105a and the second drain electrode 105b, a 10-nm-thick tungsten is formed over the semiconductor layer 103, the insulating layer 102, the first source electrode 104a, and the first drain electrode 104b. Then, a resist mask is formed over the conductive layer and a part of the conductive layer is selectively etched to form the second source electrode 105a and the second drain electrode 105b. The etching of the conductive layer may be performed by a dry etching method, a wet etching method, or both a dry etching method and a wet etching method. After the etching, the resist mask is removed (see FIG. 2C).

Note that when a transistor having a very short channel length is formed, the second source electrode 105a and the second drain electrode 105b may be formed in such a manner that a resist mask is formed by a method suitable for thin line processing, such as an electron beam exposure, extreme ultraviolet (EUV) exposure, or a liquid immersion exposure and then etching treatment is performed. Note that by the use of a positive type resist for the resist mask, the exposed region can be minimized and throughput can be thus improved. In the above manner, a transistor having a channel length of 30 nm or less can be formed.

As described above, the thickness t of the conductive layer for forming the second source electrode 105a and the second drain electrode 105b is preferably less than or equal to twice the channel length L, further preferably less than or equal to the channel length L. When the thickness t of the conductive layer for forming the second source electrode 105a and the second drain electrode 105b is determined using the channel length L as a standard, processing accuracy can be further improved, and thus variation in channel length L can be reduced. Since the variation in channel length L is reduced, a transistor with small electrical characteristic variation can be obtained.

[1-2-5. Formation of Sidewall]

Figure 2D:
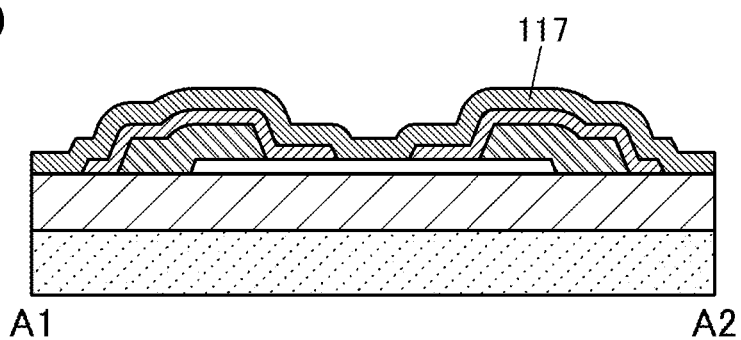
Figure 3A:
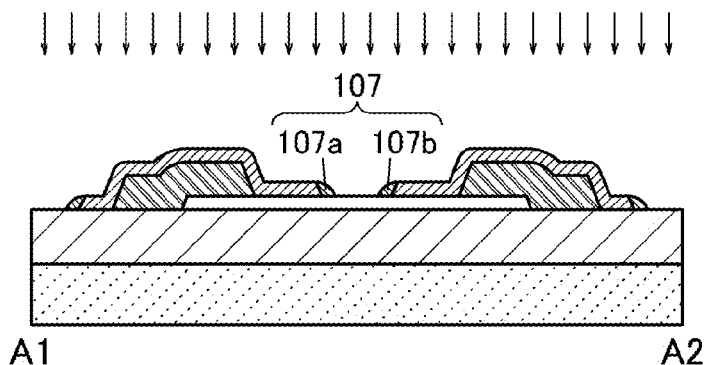
FIGS. 3A to 3D illustrate an example of a method for manufacturing a transistor.
Figure 3B:
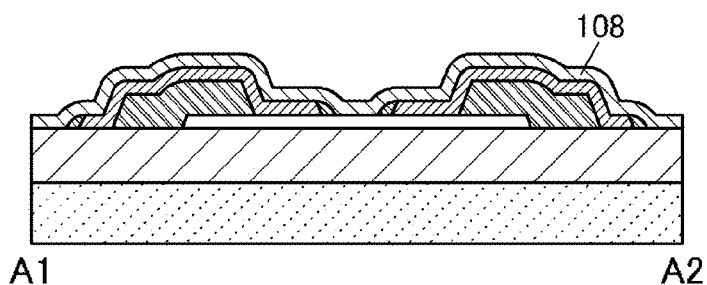
Figure 3C:
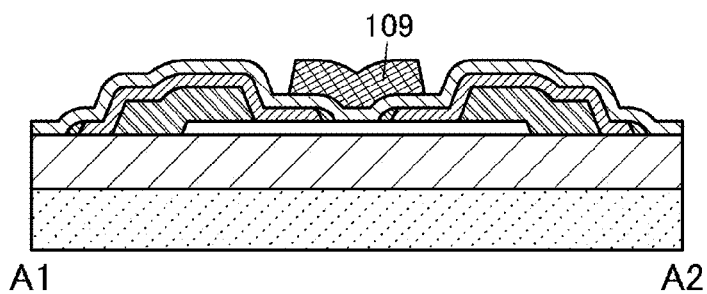
Figure 3D:
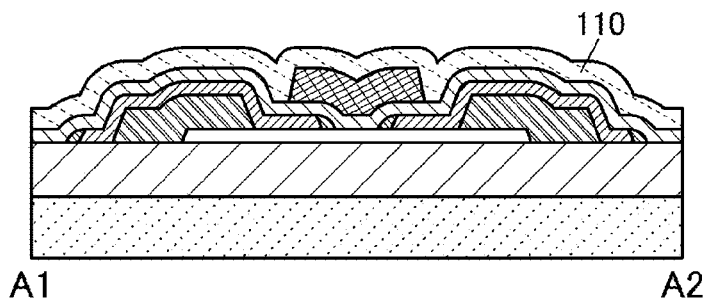

Next, as a layer 117 for forming the sidewall 107, a 10-nm-thick silicon oxynitride is formed over the second source electrode 105a and the second drain electrode 105b by a plasma CVD method (see FIG. 2D). The length Lw of the sidewall 107 can be determined by the thickness of the layer 117.

Then, the layer 117 except regions which are in contact with the side surfaces of the second source electrode 105a and the second drain electrode 105b is removed by etching. For example, only the regions in contact with the side surfaces of the second source electrode 105a and the second drain electrode 105b can be left by performing anisotropic etching using a dry etching method or the like. In this manner, the sidewall 107 (the first sidewall 107a and the second sidewall 107b) in contact with the side surfaces of the second source electrode 105a and the second drain electrode 105b can be formed (see FIG. 3A).

[1-2-6. Formation of Gate Insulating Layer]

Next, the gate insulating layer 108 is formed over the second source electrode 105a, the second drain electrode 105b, the sidewall 107, and the semiconductor layer 103. In this embodiment, as the gate insulating layer 108, a 20-nm-thick silicon oxynitride is formed by a plasma CVD method (see FIG. 3B).

[1-2-7. Formation of Gate Electrode]

Then, a conductive layer for forming the gate electrode 109 (including another electrode and another wiring formed using the same layer) is formed. In this embodiment, the conductive layer is a stack including tantalum nitride and tungsten. Specifically, a 10-nm-thick tantalum nitride is formed over the gate insulating layer 108 by a sputtering method and a 10-nm-thick tungsten is formed over the tantalum nitride layer by a sputtering method.

Then, part of the conductive layer is selectively etched using a resist mask, so that the gate electrode 109 (including other electrodes and wirings formed using the same layer) is formed. The etching of the conductive layer may be performed by a dry etching method, a wet etching method, or both a dry etching method and a wet etching method. After the etching of the conductive layer, the resist mask is removed (see FIG. 3C).

[1-2-8. Formation of Protective Insulating Layer]

Next, the insulating layer 110 which functions as a protective insulating layer covering the gate electrode 109, the first source electrode 104a, the first drain electrode 104b, the second source electrode 105a, the second drain electrode 105b, the sidewall 107, and the semiconductor layer 103 is formed. Here, as the insulating layer 110, a stack including silicon oxynitride and silicon nitride is formed. Specifically, a 20-nm-thick silicon oxynitride is formed by a plasma CVD method and a 50-nm-thick silicon nitride is formed over the silicon oxynitride by a plasma CVD method.

After the insulating layer 110 is formed, treatment for adding oxygen to the insulating layer 110 may be performed. The treatment for adding oxygen can be performed with an ion doping apparatus or a plasma treatment apparatus.

Next, heat treatment is preferably performed. The heat treatment is performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidation gas at 10 ppm or more, preferably 1% or more or 10% or more, or under reduced pressure. Alternatively, the heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate detached oxygen. By the heat treatment, excess oxygen is released from at least one of the insulating layer 102, the gate insulating layer 108, and the insulating layer 110, and oxygen vacancy of the oxide semiconductor included in the semiconductor layer 103 can be reduced.

In this manner, the transistor 100 can be manufactured.

Although the variety of films such as the metal film, the semiconductor film, and the insulating film which are described in this specification and the like can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the insulating film which have been disclosed in the embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. The material of the In—Ga—Zn—O film is not limited to the above combination, and triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidation gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of any of these gases. Note that although an $H_2O$ layer which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Further, instead of an $In(CH_3)_3$ gas, an $In(C_2H_5)_3$ gas may be used. Furthermore, a $Zn(CH_3)_2$ gas may be used.

<1-3. Example of Method for Manufacturing Semiconductor Device>

A method for forming the sidewall 107 which is different from the method described above is described as another example of the method for manufacturing the semiconductor device with reference to FIGS. 4A to 4D.

Figure 4A:
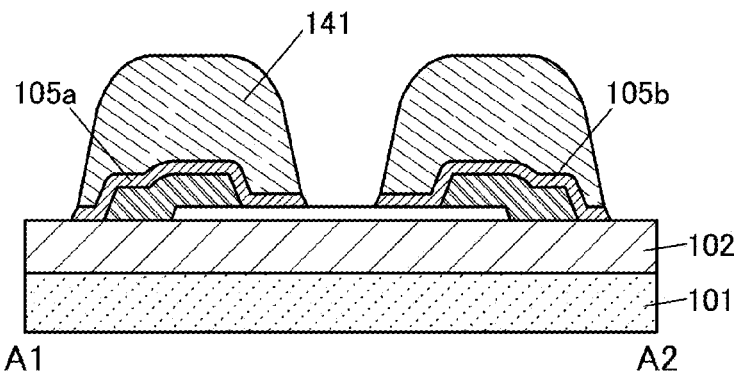
FIGS. 4A to 4D illustrate an example of a method for manufacturing a transistor.
Figure 4B:
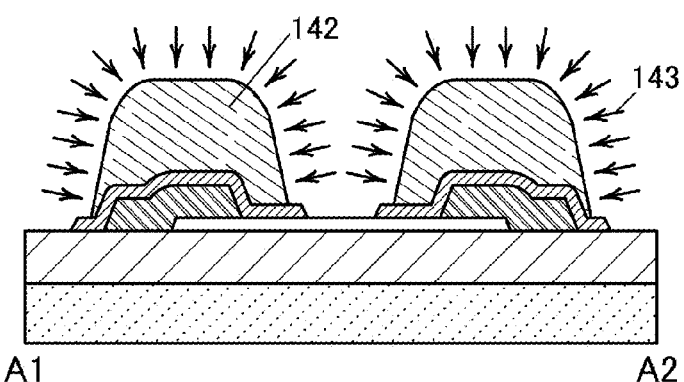
Figure 4C:
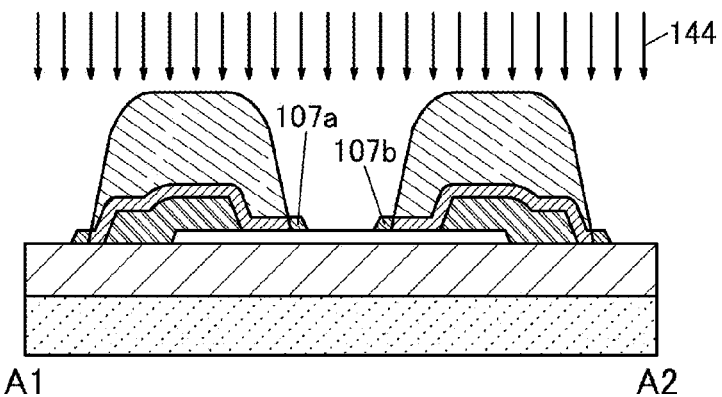

FIG. 4A is a cross-sectional view showing a state before removal of a resist mask 141 after formation of the second source electrode 105a and the second drain electrode 105b. The resist mask 141 is made to recede by using oxygen plasma 143 or the like, whereby a resist mask 142 is formed. At this time, regions of the second source electrode 105a and the second drain electrode 105b below parts of the resist mask 141 have been removed are exposed (see FIG. 4B).

Then, oxygen is introduced into the exposed regions of the second source electrode 105a and the second drain electrode 105b using the resist mask 142 as a mask. The oxygen introduction can be performed by an ion implantation method, an ion doping method, or the like. In this embodiment, oxygen ions 144 are introduced to the exposed regions by an ion implantation method. The exposed regions are oxidized by the introduction of oxygen to be the first sidewall 107a and the second sidewall 107b (see FIG. 4C).

Figure 4D:
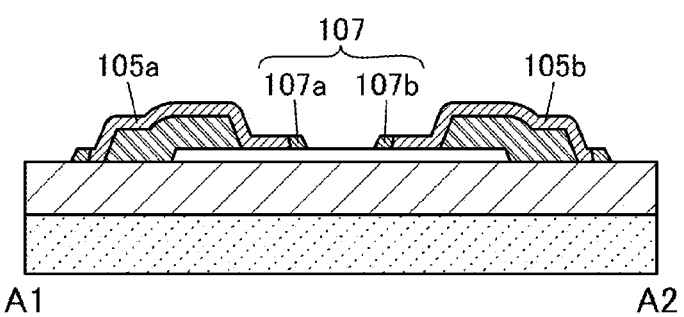

After that, the resist mask 142 is removed (see FIG. 4D). In this manner, oxygen is introduced to the peripheries of the second source electrode 105a and the second drain electrode 105b, so that the peripheries can be the sidewall 107. Therefore, the sidewall 107 contains a metal element contained in the second source electrode 105a and the second drain electrode 105b.

According to the above process, the step of forming the layer 117, the step of forming the mask for selectively etching part of the layer 117, and the step of selectively etching a part of the layer 117 can be omitted; therefore, the yield and productivity of the semiconductor device can be improved.

Further, the sidewall 107 can prevent an unintended electrical short circuit of the second source electrode 105a and the second drain electrode 105b.

This embodiment can be implemented in an appropriate combination with any of the structures described in the other embodiments.

(Embodiment 2)

In this embodiment, a transistor 200 which has a different structure from the transistor 100 described in the above embodiment is described.

<2-1. Structural Example of Semiconductor Device>

Figure 5A:
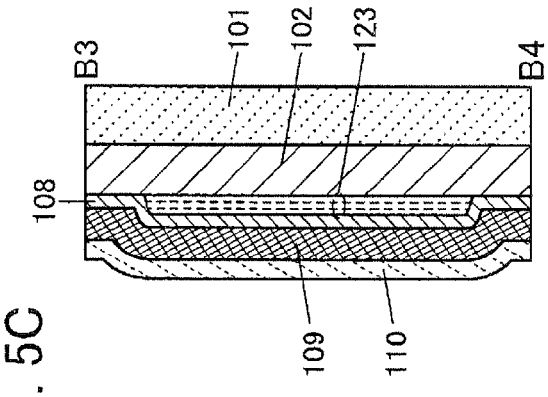
FIGS. 5A to 5D illustrate a structural example of a transistor.
Figure 5B:
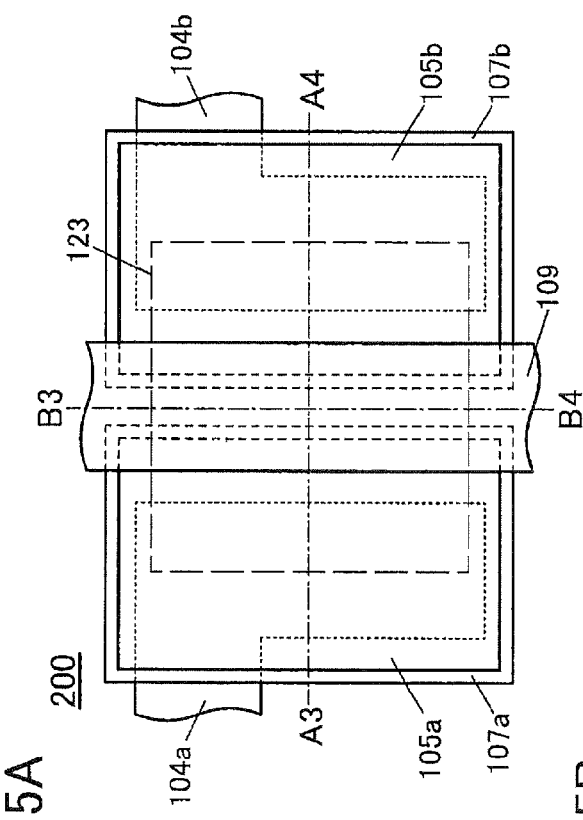
Figure 5C:
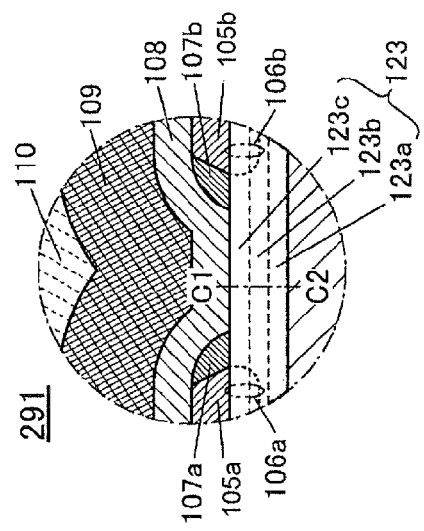
Figure 5D:
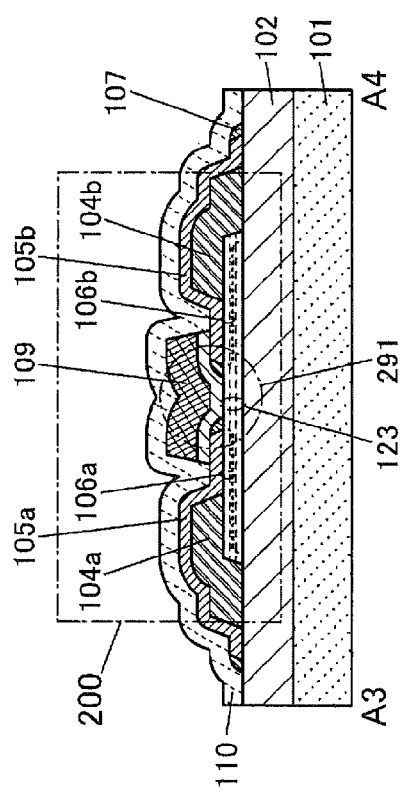

FIGS. 5A to 5D illustrate the transistor 200 of one embodiment of the present invention. FIG. 5A is a top view of the transistor 200. FIG. 5B is a cross-sectional view of a portion denoted by a dashed dotted line A3-A4 in FIG. 5A and FIG. 5C is a cross-sectional view of a portion denoted by a dashed dotted line B3-B4 in FIG. 5A.

The transistor 200 is an example of a top-gate transistor. The transistor 200 has substantially the same structure as the transistor 100 but is different from the transistor 100 in the shape of the gate insulating layer 108 in the cross-sectional structure and in that a stack 123 is provided instead of the semiconductor layer 103.

[2-1-1. Gate Insulating Layer]

The transistor 200 has a structure in which a region of the gate insulating layer 108 which does not overlap the gate electrode 109 is removed. With such a structure, in process in which parts of the insulating layer overlapping the second source electrode 105a and the second drain electrode 105b are removed to form opening portions and expose parts of surfaces of the second source electrode 105a and the second drain electrode 105b, the formation of the openings is facilitated and the productivity of the semiconductor device can be improved.

[2-1-2. Stack]

The stack 123 includes an oxide layer 123a, an oxide semiconductor layer 123b which is formed over the oxide layer 123a, and an oxide layer 123c which is formed over the oxide semiconductor layer 123b. The oxide layer 123a and the oxide layer 123c each may be an oxide layer that exhibits an insulating property or an oxide layer (an oxide semiconductor layer) that exhibits semiconductor characteristics.

Note that the oxide semiconductor layer 123b can be formed using a material and a method similar to those of the oxide semiconductor described in Embodiment 1. Further, it is preferable that the oxide semiconductor layer 123b be regarded as an intrinsic or substantially intrinsic semiconductor layer. The oxide layer 123a and the oxide layer 123c each can be formed using a material and a method similar to those of the oxide semiconductor described in Embodiment 1.

Note that depending on materials used for the oxide layer 123a, the oxide semiconductor layer 123b, and the oxide layer 123c, the boundary between the oxide layer 123a and the oxide semiconductor layer 123b or the boundary between the oxide semiconductor layer 123b and the oxide layer 123c in the stack 123 might be not observed clearly. Thus, the boundary between the oxide layer 123a and the oxide semiconductor layer 123b and the boundary between the oxide semiconductor layer 123b and the oxide layer 123c are denoted by dashed lines in drawings for describing one embodiment of the present invention.

The oxide layer 123a, the oxide semiconductor layer 123b, and the oxide layer 123c each contain one or both of In and Ga. Typical examples include an In—Ga oxide (an oxide containing In and Ga), an In—Zn oxide (an oxide containing In and Zn), and an In-M-Zn oxide (an oxide containing In, an element M, and Zn; the element M is one or more kinds of elements selected from Al, Ti, Ga, Y, Zr, La, Ce, Nd and Hf).

The oxide layer 123a and the oxide layer 123c, which are in contact with the oxide semiconductor layer 123b, are each preferably formed using a material containing at least one metal element that is the same as that contained in the oxide semiconductor layer 123b. With the use of such a material, an interface state at interfaces between the oxide semiconductor layer 123b and each of the oxide layers 123a and 123c is less likely to be generated. Accordingly, carriers are not likely to be scattered or captured at the interfaces, which results in an improvement in field-effect mobility of the transistor. Further, threshold-voltage variation of the transistor can be reduced.

The oxide layer 123a, the oxide semiconductor layer 123b, and the oxide layer 123c are formed successively without exposure to the air so as to be kept in an inert gas atmosphere, an oxidation gas atmosphere, or a reduced pressure, whereby interface states between the oxide semiconductor layer 123b and each of the oxide layers 123a and 123c can be less likely to be generated.

The thickness of the oxide layer 123a is greater than or equal to 3 nm and less than or equal to 100 nm, preferably greater than or equal to 3 nm and less than or equal to 50 nm. The thickness of the oxide semiconductor layer 123b is greater than or equal to 3 nm and less than or equal to 200 nm, preferably greater than or equal to 3 nm and less than or equal to 100 nm, further preferably greater than or equal to 3 nm and less than or equal to 50 nm. The thickness of the oxide layer 123c is greater than or equal to 3 nm and less than or equal to 50 nm, preferably greater than or equal to 3 nm and less than or equal to 20 nm.

The transistor 200 described in this embodiment has a structure in which the first source electrode 104a, the first drain electrode 104b, the second source electrode 105a, and the second drain electrode 105b are in contact with the oxide layer 123c. Therefore, the source region 106a and the drain region 106b are formed at least in the oxide layer 123c. Further, to reduce resistance between the oxide semiconductor layer 123b and the first source electrode 104a, the first drain electrode 104b, the second source electrode 105a, and the second drain electrode 105b, the oxide layer 123c is preferably formed as thin as possible.

Accordingly, the oxide layer 123a preferably has a larger thickness than the oxide layer 123c. In other words, the oxide layer 123c preferably has a smaller thickness than the oxide layer 123a.

When each of the oxide semiconductor layer 123b and the oxide layer 123a is an In-M-Zn oxide and the oxide layer 123a and the oxide semiconductor layer 123b contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide layer 123a and the oxide semiconductor layer 123b in which $y_1/x_1$ is 1.5 times or more as large as $y_2/x_2$ are selected. Still further preferably, the oxide layer 123a and the oxide semiconductor layer 123b in which $y_1/x_1$ is twice or more as large as $y_2/x_2$ are selected. Still further preferably, the oxide layer 123a and the oxide semiconductor layer 123b in which $y_1/x_1$ is three times or more as large as $y_2/x_2$ are selected. At this time, $y_1$ is preferably greater than or equal to $x_1$ in the oxide semiconductor layer 123b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the oxide layer 123a has the above structure, the oxide layer 123a can be a layer in which oxygen vacancy is less likely to occur than in the oxide semiconductor layer 123b.

Further alternatively, when each of the oxide semiconductor layer 123b and the oxide layer 123c is an In-M-Zn oxide and the oxide semiconductor layer 123b and the oxide layer 123c contain In, M, and Zn at an atomic ratio of $x_2:y_2:z_2$ and an atomic ratio of $x_3:y_3:z_3$ respectively, $y_3/x_3$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor layer 123b and the oxide layer 123c in which $y_3/x_3$ is 1.5 times or more as large as $y_2/x_2$ are selected. Still further preferably, the oxide semiconductor layer 123b and the oxide layer 123c in which $y_3/x_3$ is twice or more as large as $y_2/x_2$ are selected. Still further preferably, the oxide semiconductor layer 123b and the oxide layer 123c in which $y_3/x_3$ is three times or more as large as $y_2/x_2$ are selected. In the oxide semiconductor layer 123b at this time, $y_2$ is preferably larger than or equal to $x_2$ because the transistor can have stable electrical characteristics. However, when $y_2$ is three times or more as large as $x_2$, the field-effect mobility of the transistor is reduced; accordingly, $y_2$ is preferably smaller than three times $x_2$. When the oxide layer 123c has the above structure, the oxide layer 123c can be a layer in which oxygen vacancy is less likely to occur than in the oxide semiconductor layer 123b.

When an In-M-Zn oxide is used as the oxide layer 123a, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %. When an In-M-Zn oxide is used as the oxide semiconductor layer 123b, the atomic ratio between In and M is preferably as follows: the atomic percentage of In is greater than or equal to 25 atomic % and the atomic percentage of M is less than 75 atomic %; further preferably, the atomic percentage of In is greater than or equal to 34 atomic % and the atomic percentage of M is less than 66 atomic %. When an In-M-Zn oxide is used as the oxide layer 123c, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

For example, an In—Ga—Zn oxide which is formed using a target having an atomic ratio of In:Ga:Zn=1:3:2, 1:3:4, 1:6:4, 1:9:6, or 1:9:0 can be used for each of the oxide layers 123a and 123c containing In or Ga, and an In—Ga—Zn oxide which is formed using a target having an atomic ratio of In:Ga:Zn=1:1:1 or 3:1:2 can be used for the oxide semiconductor layer 123b. In each of the oxide layer 123a, the oxide layer 123c, and the oxide semiconductor layer 123b, the proportions of the atoms in the atomic ratio vary within a range of ±20% as an error.

In the oxide semiconductor layer 123b, hydrogen, nitrogen, carbon, silicon, and metal elements other than main components serve as impurities. In order to reduce the impurities in the oxide semiconductor layer 123b, it is preferable to also reduce the impurities in the oxide layer 123a and the oxide layer 123c which are close to the oxide semiconductor layer 123b to an extent almost equal to that in the oxide semiconductor layer 123b.

In the oxide semiconductor, hydrogen, nitrogen, carbon, silicon, and a metal element other than a main component are impurities. Therefore, in order to reduce the impurities in the oxide semiconductor layer 123b, it is preferable to also reduce the impurities in the oxide layer 123a and the oxide layer 123c which are close to the oxide semiconductor layer 123b to an extent almost equal to that in the oxide semiconductor layer 123b.

Here, the crystallinity of each of the oxide layer 123a, the oxide semiconductor layer 123b, and the oxide layer 123c, which are included in the stack 123, is described.

The oxide layer 123a, the oxide semiconductor layer 123b, and the oxide layer 123c in the stack 123 may be amorphous or crystalline. Here, "crystalline" includes "microcrystalline", "polycrystalline", "single crystalline" and the like. All the layers that contain a crystal are crystalline.

It is preferable that at least the oxide semiconductor layer 123b in the stack 123 be crystalline. It is particularly preferable that at least the oxide semiconductor layer 123b be a CAAC-OS film.

In order that oxide semiconductor layer 123b is the CAAC-OS, the surface where the oxide semiconductor layer 123b is formed is preferably amorphous or preferably has crystallinity similar to that of a CAAC-OS. When the surface where the oxide semiconductor layer 123b is formed is crystalline, crystallinity of the oxide semiconductor layer 123b is easily disordered and the CAAC-OS film is not easily formed. In the case where the surface where the oxide semiconductor layer 123b is formed has a structure similar to that of the CAAC-OS film, the oxide semiconductor layer 123b easily becomes the CAAC-OS film.

Accordingly, in order that the oxide semiconductor layer 123b is a CAAC-OS, it is preferable that the oxide layer 123a serving as a base be amorphous or have a crystalline structure similar to that of a CAAC-OS.

In addition, when the oxide semiconductor layer 123b is the CAAC-OS, the oxide layer 123c formed over the oxide semiconductor layer 123b tends to have a crystalline structure similar to that of the CAAC-OS. Note that the oxide layer 123c is not necessarily crystalline structure but may be amorphous.

In the transistor including the stack 123, the oxide semiconductor layer 123b is a layer in which a channel is formed; thus, it is preferable that the oxide semiconductor layer 123b have high crystallinity so that the transistor can have stable electric characteristics.

[2-1-3. Physical Property Analysis of Stack]

Here, results of physical property analysis of the stack 123 described in this embodiment are described.

[2-1-3-1. Silicon Concentration of Stack]

First, the silicon concentration of each of the layers included in the stack 123 is described with reference to FIG. 8.

Here, the oxide layer 123a is an oxide layer formed by a sputtering method using a target having an atomic ratio of In:Ga:Zn=1:3:2. Note that the oxide layer 123a was formed in such a manner that an argon gas (flow rate: 30 sccm) and an oxygen gas (flow rate: 15 sccm) were used as a sputtering gas, the pressure was set to 0.4 Pa, the substrate temperature was set to 200° C., and a DC power of 0.5 kW was applied.

The oxide semiconductor layer 123b is an oxide semiconductor layer formed by a sputtering method using a target having an atomic ratio of In:Ga:Zn=1:1:1. Note that the oxide semiconductor layer 123b was formed in such a manner that an argon gas (flow rate: 30 sccm) and an oxygen gas (flow rate: 15 sccm) were used as a sputtering gas, the pressure was set to 0.4 Pa, the substrate temperature was set to 300° C., and a DC power of 0.5 kW was applied.

The oxide layer 123c is an oxide layer formed by a sputtering method using a target having an atomic ratio of In:Ga:Zn=1:3:2. Note that the oxide layer 123c was formed in such a manner that an argon gas (flow rate: 30 sccm) and an oxygen gas (flow rate: 15 sccm) were used as a sputtering gas, the pressure was set to 0.4 Pa, the substrate temperature was set to 200° C., and a DC power of 0.5 kW was applied.

Samples are each formed in such a manner that the oxide layer 123a with a thickness of 10 nm, the oxide semiconductor layer 123b with a thickness of 10 nm over the oxide layer 123a, and the oxide layer 123c with a thickness of 10 nm over the oxide semiconductor layer 123b are provided as the stack 123 over a silicon wafer, and one of the samples is not subjected to heat treatment and the other sample is subjected to heat treatment at 450° C. for two hours. The secondary ion intensities of In, Ga, and Zn in a depth direction, and the Si concentration (atoms/cm$^3$) in a depth direction of the samples measured by ToF-SIMS (Time-of-flight secondary ion mass spectrometry) are shown.

Figure 8:
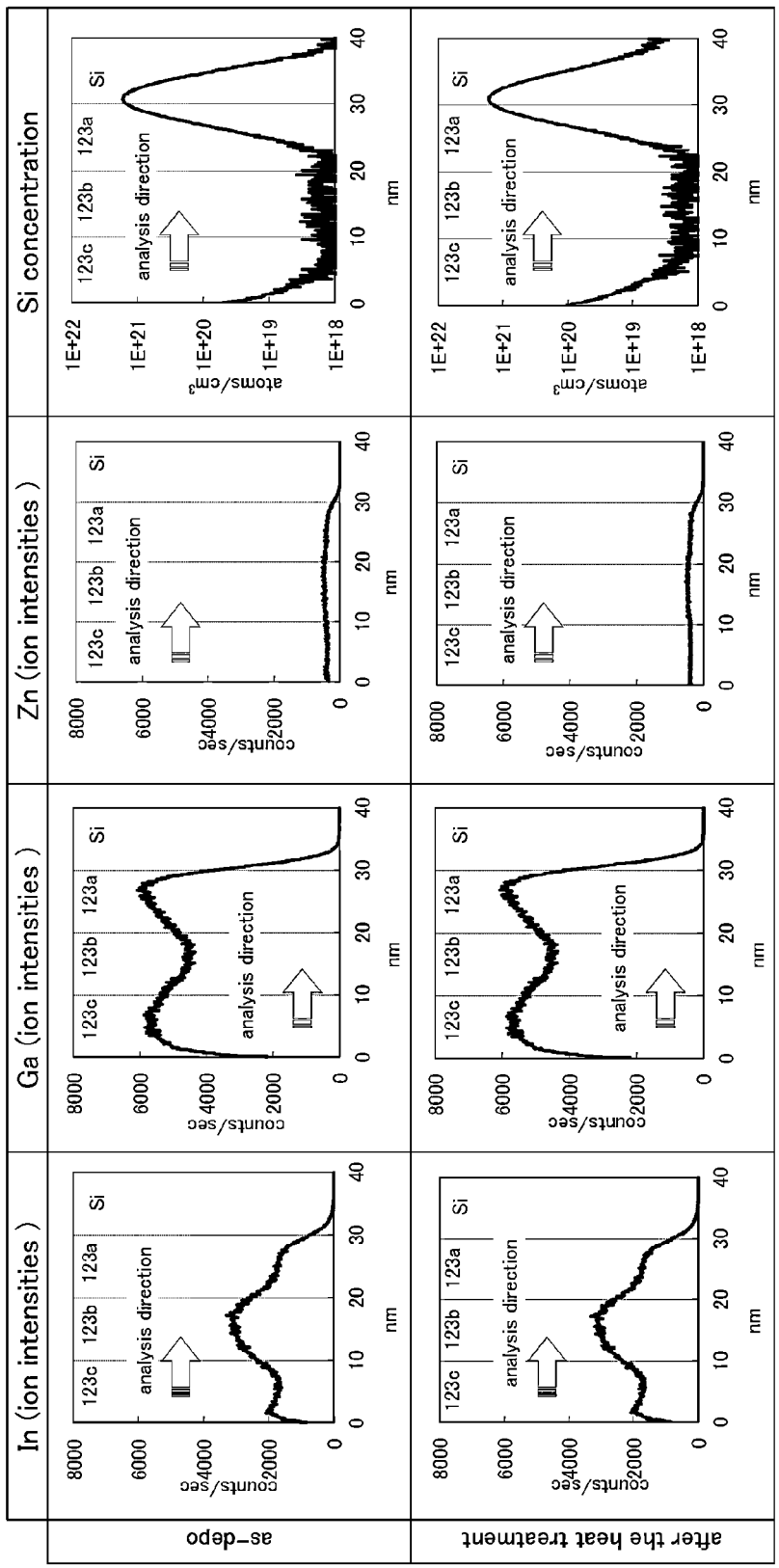
FIG. 8 shows ToF-SIMS analysis results of a stack.

FIG. 8 shows that the compositions of the layers included in the stack 123 are changed depending on the compositions of the respective targets used at the time of the deposition. Note that the compositions of the layers cannot be simply compared using FIG. 8.

FIG. 8 indicates that the interface between the silicon wafer and the oxide layer 123a and the top surface of the oxide layer 123c have high Si concentrations. Moreover, FIG. 8 shows that the concentration of Si in the oxide semiconductor layer 123b is about $1 \times 10^{18}$ atoms/cm$^3$, which is the lower limit of detection in ToF-SIMS. This is probably because, owing to the existence of the oxide layers 123a and 123c, the oxide semiconductor layer 123b is not influenced by silicon due to the silicon wafer or the surface contamination on the oxide layer 123c.

That is, the oxide semiconductor layer 123b is provided between the oxide layer 123a and the oxide layer 123c so as not to be in direct contact with the insulating layer containing silicon, silicon in the insulating layer can be prevented from entering the oxide semiconductor layer 123b.

Further, comparison of the sample subjected to the heat treatment with an as-deposited sample (the sample not subjected to heat treatment, referred to as "as-depo" in FIG. 8) indicates that silicon is not likely to be diffused through the heat treatment though entry of silicon occurs at the time of deposition.

[2-1-3-2. CPM Measurement of Localized State]

Next, results of measurement of the density of localized states of the stack 123 formed over the glass substrate by a constant photocurrent method (CPM) are described. By reducing the density of the localized states in the channel formation region, the transistor can have stable electrical characteristics.

In order that the transistor has high field-effect mobility and stable electrical characteristics, the absorption coefficient due to localized states measured by CPM is preferably lower than $1 \times 10^{-3}$ cm$^{-1}$, further preferably lower than $3 \times 10^{-4}$ cm$^{-1}$.

The stack 123 on which CPM measurement was performed is described below.

The oxide layer 123a is an oxide layer formed by a sputtering method using a target having an atomic ratio of In:Ga:Zn=1:3:2. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

The oxide semiconductor layer 123b is an oxide semiconductor layer formed by a sputtering method using a target having an atomic ratio of In:Ga:Zn=1:1:1. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

The oxide layer 123c is an oxide layer formed by a sputtering method using a target having an atomic ratio of In:Ga:Zn=1:3:2. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

Here, in order to improve the accuracy of the CPM measurement, the stack 123 to be measured needs to have a certain thickness. Specifically, the thicknesses of the oxide layer 123a, the oxide semiconductor layer 123b, and the oxide layer 123c were set to 30 nm, 100 nm, and 30 nm, respectively.

In the CPM measurement, the amount of light with which a surface of the sample between terminals is irradiated is adjusted so that a photocurrent value is kept constant in the state where voltage is applied between a first electrode and a second electrode provided in contact with the stack 123, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

Figure 9A:
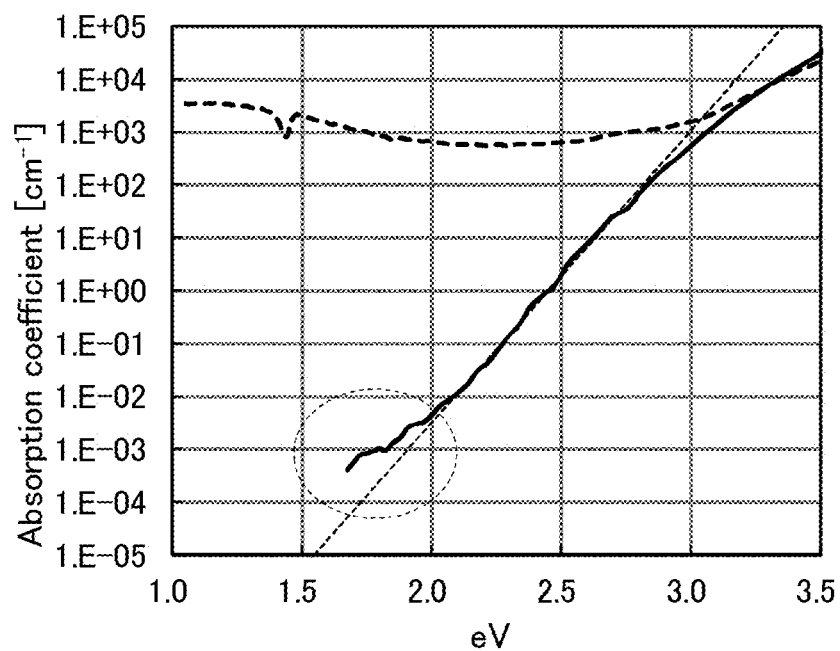
FIGS. 9A and 9B each show CPM measurement results of a stack.
Figure 9B:
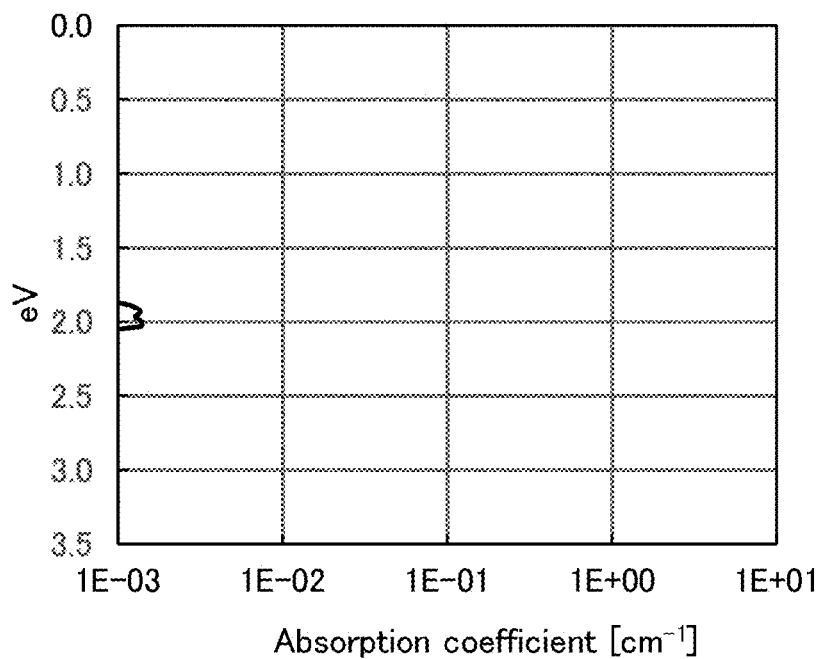

FIG. 9A shows results of fitting the absorption coefficient (dotted line) measured using a spectrophotometer and the absorption coefficient (solid line) measured by CPM in the range of energy higher than or equal to the energy gap of each layer in the stack 123. Note that the Urbach energy obtained based on the absorption coefficient measured by CPM was 78.7 meV. The integral value of the absorption coefficient in the energy range was derived in such a manner that a background (thin dotted line) was subtracted from the absorption coefficient measured by CPM in the energy range shown with a dashed line circle in FIG. 9A (see FIG. 9B). As a result, the absorption coefficient due to the localized states of this sample was found to be $2.02 \times 10^{-4}$ cm$^1$.

The localized states obtained here are probably due to an impurity or a defect. From the above, the stack has an extremely low density of states due to an impurity or a defect. That is, the transistor including the stack has high field-effect mobility and stable electrical characteristics.

[2-1-3-3. Energy Band Structure of Stack]

Figure 10:
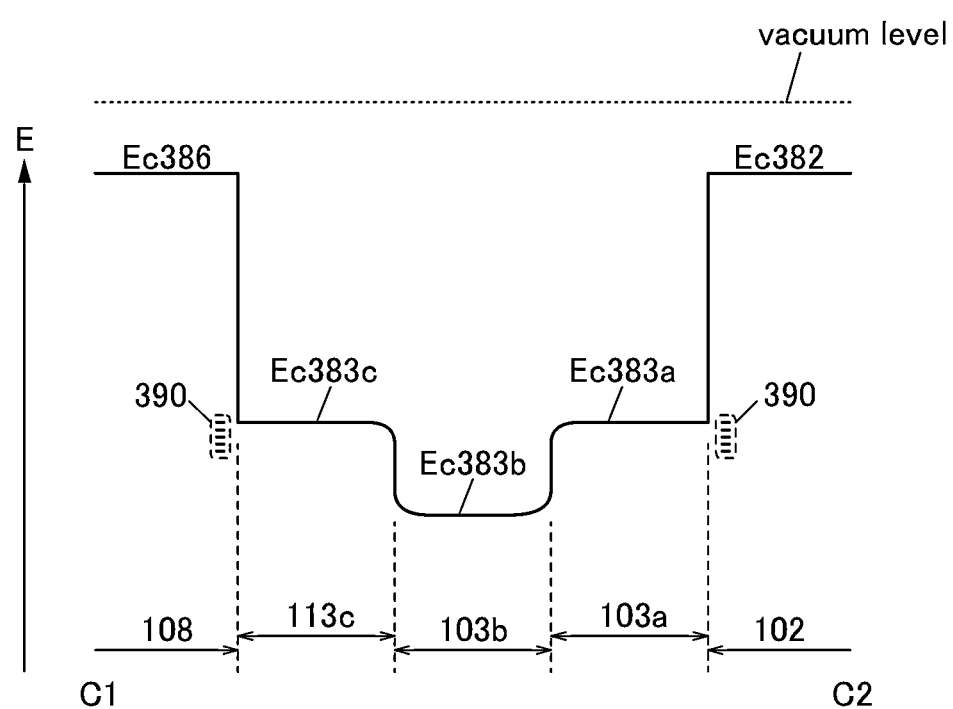
FIG. 10 shows an energy band structure of a stack.

A function and an effect of the stack 123 in this embodiment are described using energy band structure diagrams of FIG. 10. FIG. 10 illustrates the energy band structure of a portion along a dashed dotted line C1-C2 in FIG. 5D. Thus, FIG. 10 illustrates the energy band structure of a channel formation region of the transistor 200.

In FIG. 10, Ec382, Ec383a, Ec383b, Ec383c, and Ec386 are the energies of bottoms of the conduction band in the insulating layer 102, the oxide layer 123a, the oxide semiconductor layer 123b, the oxide layer 123c, and the gate insulating layer 108, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON SAS). Further, the difference in energy between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 102 and the gate insulating layer 108 are insulators, Ec382 and Ec386 are closer to the vacuum level (have a smaller electron affinity) than Ec383a, Ec383b, and Ec383c.

Further, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Further, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

The energy of the bottom of the conduction band continuously changes between the oxide layer 123a and the oxide semiconductor layer 123b and between the oxide semiconductor layer 123b and the oxide layer 123c. That is, no interface state or few interface states exist at these interfaces.

Accordingly, electrons transfer mainly through the oxide semiconductor layer 123b in the stack 123 having the above energy band structure. Therefore, even when an interface state exists at an interface with the insulating film that is the outside of the stack 123, the interface state hardly influences the transfer of the electrons. In addition, since no interface state or few interface states exist between the layers included in the stack 123, the transfer of electrons is not interrupted in the region. Accordingly, the oxide semiconductor layer 123b of the stack 123 has high electron mobility.

Note that although trap states 390 due to impurities or defects might be formed in the vicinity of the interface between the oxide layer 123a and the insulating layer 102 and in the vicinity of the interface between the oxide layer 123c and the gate insulating layer 108 as illustrated in FIG. 10, the oxide semiconductor layer 123b can be separated from the trap states owing to the existence of the oxide layer 123a and the oxide layer 123c.

However, in the case where an energy difference between Ec383a or Ec383c and Ec383b is small, electrons in the oxide semiconductor layer 123b might reach the trap state by passing over the energy gap. Since the electron is trapped at the trap state, a negative fixed charge is generated at the interface with the insulating film, causing the threshold voltage of the transistor to be shifted in the positive direction.

Therefore, each of the energy differences between Ec383a and Ec383b and between Ec383c and Ec383b is preferably set to be larger than or equal to 0.1 eV, further preferably larger than or equal to 0.15 eV, in which case a change in the threshold voltage of the transistor can be reduced and the transistor can have favorable electrical characteristics.

The band gap of each of the oxide layer 123a and the oxide layer 123c is preferably wider than that of the oxide semiconductor layer 123b.

<2-2. Example of Method for Manufacturing Semiconductor Device>

[2-2-1. Processing Method of Gate Insulating Layer]

The selective removal of the gate insulating layer 108 may be performed using the gate electrode 109 as a mask after formation of the gate electrode 109. Part of the gate insulating layer 108 can be selectively removed by a dry etching method or a wet etching method using the gate electrode 109 as a mask.

Note that the etching of the gate insulating layer 108 may be performed successively after the conductive layer to be the gate electrode 109 is etched before the resist mask for forming the gate electrode 109 is removed.

[2-2-2. Formation of Stack]

In the case where the oxide layer 123a, the oxide semiconductor layer 123b, and the oxide layer 123c that are included in the stack 123 are formed by a sputtering method, a sputtering target is selected as appropriate in accordance with the compositions of the oxide layer 123a, the oxide semiconductor layer 123b, and the oxide layer 123c.

Note that heating during the formation of the stack 123 may be performed at a substrate temperature of higher than or equal to 100° C. and lower than or equal to 500° C., preferably higher than or equal to 170° C. and lower than or equal to 350° C.

In this embodiment, first to third films to be the oxide layer 123a, the oxide semiconductor layer 123b, and the oxide layer 123c are formed by a sputtering method. First, a 20-nm-thick In—Ga—Zn oxide is formed as a first film to be the oxide layer 123a over the insulating layer 102, using a target having an atomic ratio of In:Ga:Zn=1:3:2. Then, a 15-nm-thick In—Ga—Zn oxide is formed as a second film to be the oxide semiconductor layer 123b over the first film, using a target having an atomic ratio of In:Ga:Zn=1:1:1. After that, a 5-nm-thick In—Ga—Zn oxide is formed as a third film to be the oxide layer 123c over the oxide semiconductor layer 123b, using a target having an atomic ratio of In:Ga:Zn=1:3:2. In this embodiment, a CAAC-OS film is used as the oxide semiconductor layer 123b.

After the first to third films are formed, a resist mask is formed over the third film, and the first to third films are etched to have desired shapes using the resist mask, whereby the island-shaped stack 123 is formed. The resist mask can be formed by a photolithography method, a printing method, an inkjet method, or the like as appropriate. Formation of the resist mask by an inkjet method needs no photomask; thus, manufacturing cost can be reduced.

The etching of the first to third films can be performed in a manner similar to that of etching of the oxide semiconductor film described in Embodiment 1. Note that a region of the insulating layer 102 which does not overlap the island-shaped stack 123 might be etched depending on the etching conditions.

After the etching treatment, the resist mask is removed. After the resist mask is removed, the stack 123 may be subjected to heat treatment in which the temperature of the substrate 101 is higher than or equal to 100° C. and lower than or equal to 500° C., preferably higher than or equal to 170° C. and lower than or equal to 350° C.

(Embodiment 3)

In this embodiment, a transistor 300 which has a different structure from the transistor 100 and the transistor 200 described in the above embodiments is described.

<3-1. Structural Example of Semiconductor Device>

Figure 6A:
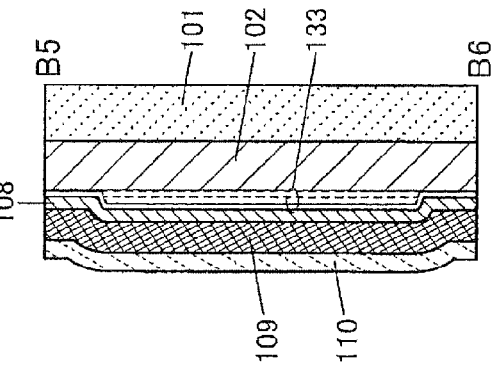
FIGS. 6A to 6D illustrate a structural example of a transistor.
Figure 6C:
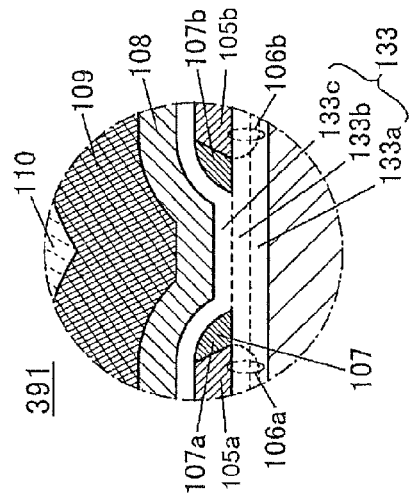
Figure 6B:
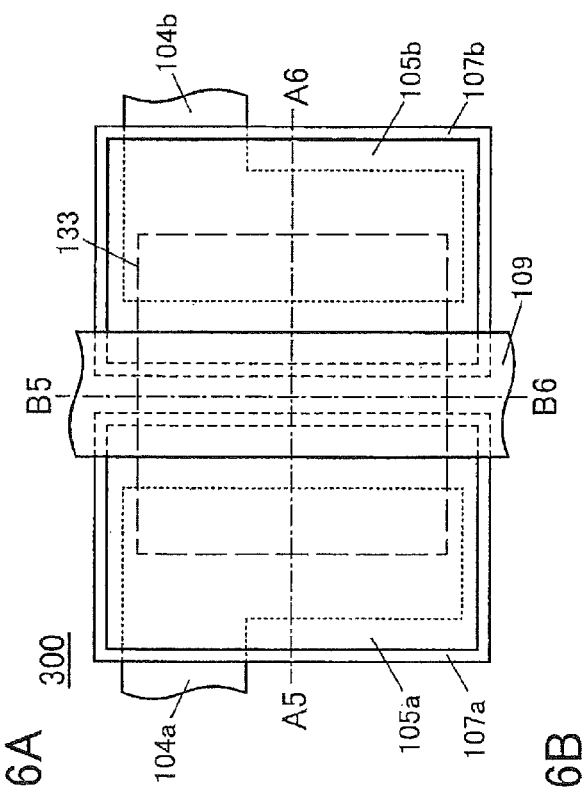
Figure 6D:
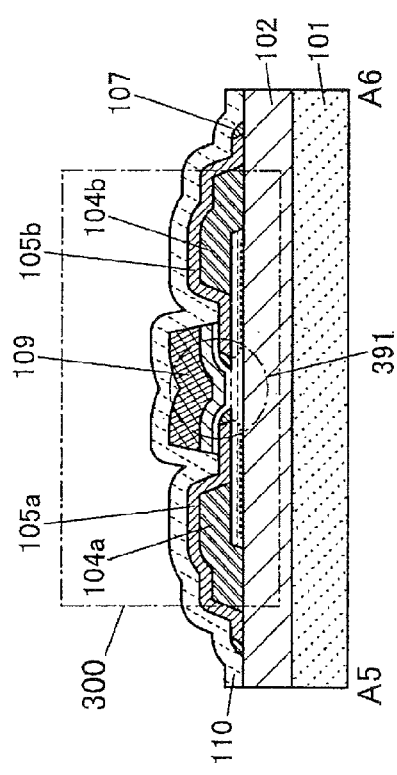

FIGS. 6A to 6D illustrate the transistor 300 which is one embodiment of a semiconductor device. FIG. 6A is a top view of the transistor 300. FIG. 6B is a cross-sectional view of a portion denoted by a dashed dotted line A5-A6 in FIG. 6A, and FIG. 6C is a cross-sectional view of a portion denoted by a dashed dotted line B5-B6 in FIG. 6A. FIG. 6D is an enlarged view of a part 391 in FIG. 6B.

The transistor 300 is an example of a top-gate transistor. The transistor 300 has substantially the same structure as the transistor 200 but is different from the transistor 200 in that a stack 133 is provided instead of the stack 123 in the cross-sectional structure.

[3-1-1. Stack]

The stack 133 includes an oxide layer 133a, an oxide semiconductor layer 133b which is formed over the oxide layer 133a, and an oxide layer 133c which is formed over the oxide semiconductor layer 133b. The oxide layer 133a and the oxide layer 133c each may be an oxide layer that exhibits an insulating property or an oxide layer (an oxide semiconductor layer) that exhibits semiconductor characteristics.

The oxide layer 133a, the oxide semiconductor layer 133b, and the oxide layer 133c can be formed using materials and methods similar to those of the oxide layer 123a, the oxide semiconductor layer 123b, and the oxide layer 123c, respectively. However, the formation position of the oxide layer 133c is different from that of the oxide layer 123c.

Specifically, after the oxide layer 133a and the oxide semiconductor layer 133b are formed, the first source electrode 104a, the first drain electrode 104b, the second source electrode 105a, the second drain electrode 105b, the first sidewall 107a, and the second sidewall 107b are formed. Then, the oxide layer 133c is formed over the second source electrode 105a and the second drain electrode 105b.

The transistor 300 described in this embodiment has a structure in which the first source electrode 104a, the first drain electrode 104b, the second source electrode 105a, and the second drain electrode 105b are in direct contact with the oxide semiconductor layer 133b where the channel is formed; therefore, the source region 106a and the drain region 106b can have smaller resistivity than those of the transistor 200.

Further, in the channel formation region, the stack 133 can function in a manner similar to that of the stack 123. Accordingly, the transistor 300 described in this embodiment can have electrical characteristics that are equal to or greater than those of the transistor 200.

Note that the transistor 300 described in this embodiment has a structure in which a region of the gate insulating layer 108 and a region of the oxide layer 133c over which the gate electrode 109 is not provided are removed. With such a structure, in process in which parts of the insulating layer overlapping the second source electrode 105a and the second drain electrode 105b are removed to form opening portions and expose parts of surfaces of the second source electrode 105a and the second drain electrode 105b, the formation of the openings is facilitated and the productivity of the semiconductor device can be improved.

The selective removal of the gate insulating layer 108 and the oxide layer 133c may be performed using the gate electrode 109 as a mask after formation of the gate electrode 109. A part of the gate insulating layer 108 and a part of the oxide layer 133c can be selectively removed by a dry etching method or a wet etching method using the gate electrode 109 as a mask.

Note that the selective removal of the gate insulating layer 108 and the oxide layer 133c may be performed successively after the conductive layer to be the gate electrode 109 is etched before the resist mask for forming the gate electrode 109 is removed.

This embodiment can be implemented in an appropriate combination with any of the structures described in the other embodiments.

(Embodiment 4)

In this embodiment, a transistor which has a different structure from the transistor 100, the transistor 200, and the transistor 300 described in the above embodiments is described.

<4-1. Structural Example of Semiconductor Device: Transistor Including Back Gate Electrode>

Figure 7A:
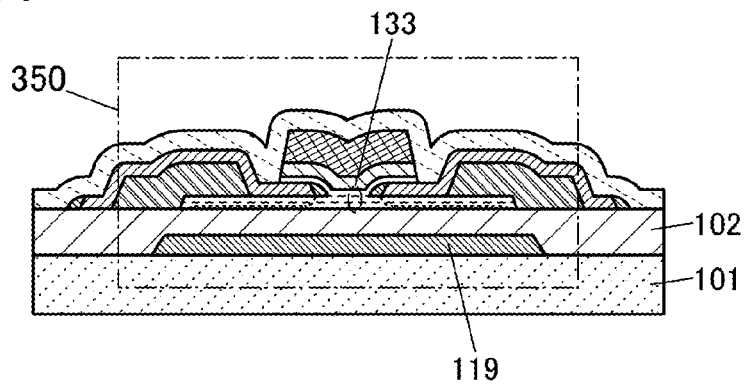
FIGS. 7A to 7C each illustrate a structural example of a transistor.

FIG. 7A is a cross-sectional view illustrating a stacked-layer structure of a transistor 350. The transistor 350 has a structure obtained by adding a back gate electrode 119 to the transistor 300. Specifically, the back gate electrode 119 is formed in a region over the substrate 101 and over which the channel formation region is positioned with the insulating layer 102 provided therebetween.

The back gate electrode 119 is provided so that the channel formation region of the stack 133 is positioned between the gate electrode 109 and the back gate electrode 119. The back gate electrode 119 is formed using a conductive layer and can function in a manner similar to that of the gate electrode 109. By changing the potential of the back gate electrode 119, the threshold voltage of the transistor 350 can be changed. Note that the potential of the back gate electrode may be the same as that of the gate electrode 109 or may be a ground potential GND or a predetermined potential.

The back gate electrode 119 can be formed using a material and a method similar to those of the gate electrode 109, the first source electrode 104a, the first drain electrode 104b, and the like.

When the back gate electrode 119 is formed using a conductive material having a light-blocking property, light entering the channel formation region from the back gate electrode 119 side can be blocked, which inhibits generation of carriers caused by light irradiation of the channel formation region. Therefore, the transistor 350 can have favorable electrical characteristics, and deterioration of the electrical characteristics of the transistor 350 due to light irradiation (such deterioration is also referred to as light deterioration) can be inhibited. Providing the back gate electrode in the transistor enables a highly reliable semiconductor device to be manufactured. Further, when the back gate electrode 119 is formed to be larger than the stack 133, light deterioration can be inhibited more surely. An insulating layer may be formed between the substrate 101 and the back gate electrode 119.

Further, the gate electrode 109 and the back gate electrode 119 are formed using a conductive layer and thus have a function of preventing an electric field generated in the outside of the transistor from influencing the semiconductor layer where the channel is formed (in particular, a function of preventing static electricity). That is, the variation in the electric characteristics of the transistor due to the influence of external electric field such as static electricity can be prevented. Further, when the back gate electrode is provided, the amount of change in the threshold voltage of the transistor before and after BT test can be reduced.

Note that after the insulating layer 102 is formed over the back gate electrode 119, in order to reduce surface roughness of the insulating layer 102, planarization treatment may be performed on the surface of the insulating layer 102. As the planarization treatment, etching treatment or the like can be employed instead of polishing treatment such as chemical mechanical polishing (hereinafter, also referred to as CMP treatment). The planarization treatment may be performed with a combination of CMP treatment and etching treatment.

The back gate electrode 119 can be provided in each of the transistor 100 and the transistor 200 in a manner similar to that of the transistor 350. The transistor 300 is replaced with the transistor 100 and the stack 133 is replaced with the semiconductor layer 103 in the description of the transistor 350, whereby the structure of the transistor 100 provided with the back gate electrode 119 can be described. The transistor 300 is replaced with the transistor 200 and the stack 133 is replaced with the stack 123 in the description of the transistor 350, whereby the structure of the transistor 200 provided with the back gate electrode 119 can be described.

<4-2. Structural Example of Semiconductor Device: Bottom-Gate Transistor>

Figure 7B:
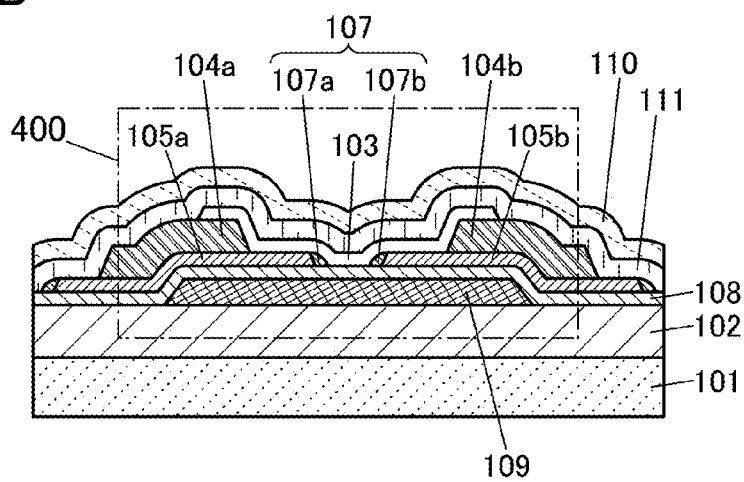
Figure 7C:
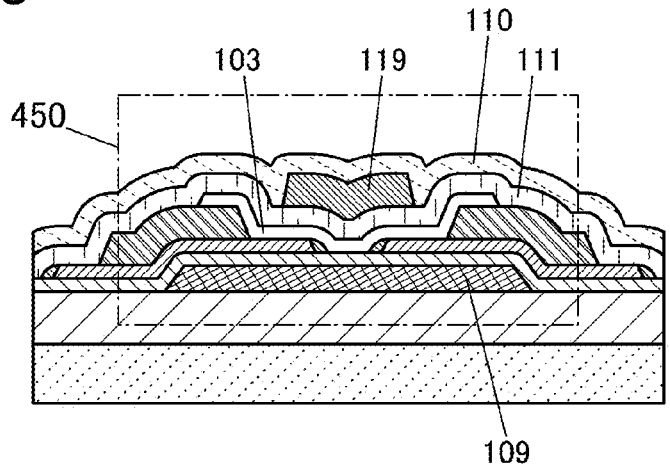

FIG. 7B is a cross-sectional view illustrating a stacked-layer structure of a transistor 400. The transistor 400 is an example of a bottom-gate transistor, in which a gate electrode is provided below a semiconductor layer.

The transistor 400 illustrated in FIG. 7B is formed over the insulating layer 102. The insulating layer 102 is formed over the substrate 101. Further, the transistor 400 includes the semiconductor layer 103, the first source electrode 104a, the first drain electrode 104b, the second source electrode 105a, the second drain electrode 105b, the first sidewall 107a, the second sidewall 107b, the gate insulating layer 108, and the gate electrode 109. The insulating layer 110 is formed over the transistor 400 in FIG. 7B.

Specifically, the gate electrode 109 is formed over the insulating layer 102, and the gate insulating layer 108 is formed over the gate electrode 109. The second source electrode 105a and the second drain electrode 105b are formed over the gate insulating layer 108 to overlap parts of the gate electrode 109. The first source electrode 104a is formed over the second source electrode 105a. The first drain electrode 104b is formed over the second drain electrode 105b.

The first sidewall 107a is formed at the end portion of the second source electrode 105a, and the second sidewall 107b is formed at the end portion of the second drain electrode 105b. A part of the first sidewall 107a is in contact with a side surface of the second source electrode 105a, and another part of the first sidewall 107a is in contact with the semiconductor layer 103. A part of the second sidewall 107b is in contact with a side surface of the second drain electrode 105b, and another part of the second sidewall 107b is in contact with the semiconductor layer 103.

The semiconductor layer 103 is formed over the first source electrode 104a, the first drain electrode 104b, the second source electrode 105a, the second drain electrode 105b, the gate insulating layer 108, and the sidewall 107. Note that the stack 123 may be used in place of the semiconductor layer 103.

The part of the second source electrode 105a extends beyond the end portion of the first source electrode 104a to be in contact with the semiconductor layer 103. The part of the second drain electrode 105b extends beyond the end portion of the first drain electrode 104b to be in contact with the semiconductor layer 103.

An insulating layer 111 is formed to cover the semiconductor layer 103, and the insulating layer 110 is formed over the insulating layer 111. The insulating layer 111 can be formed using a material and a method similar to those of the insulating layer 102. Note that in the case where an oxide semiconductor is used for the semiconductor layer 103, an insulating layer containing excess oxygen is preferably used as the insulating layer 111.

Also in the bottom-gate transistor, the sidewall 107 can relieve the electric-field strength in the vicinity of the source electrode or the drain electrode; therefore, hot-carrier degradation of the transistor is unlikely to occur. Therefore, the reliability of the transistor can be improved. Further, the reliability of a semiconductor device including the transistor can be improved.

A short channel effect is also unlikely to occur in a transistor with a channel length of 50 nm or less; therefore, favorable electrical characteristics of the transistor can be obtained. According to one embodiment of the present invention, even when the channel length is less than or equal to 30 nm, the transistor with favorable electrical characteristics can be obtained. Therefore, a semiconductor device with favorable characteristics can be obtained with the use of the transistor.

<4-3. Structural Example of Semiconductor Device: Transistor Including Back Gate Electrode>

The transistor 450 has a structure obtained by adding the back gate electrode 119 to the transistor 400. Specifically, in the transistor 450, the back gate electrode 119 is provided in a region which overlaps the channel formation region with the insulating layer 111 provided therebetween.

Although the insulating layer 110 is formed over the back gate electrode 119, the back gate electrode 119 may be formed over the insulating layer 110. Note that the back gate electrode 119 is described before and thus the detail description is omitted here.

This embodiment can be implemented in appropriate combination with any of the structures described in the other embodiments.

(Embodiment 5)

In this embodiment, a semiconductor device including the transistor described in the above embodiment is described as an example.

<5-1. Microcomputer>

[5-1-1. Block Diagram of Microcomputer]

The transistor described in the above embodiment can be applied to microcomputers (hereinafter referred to as micro control units (MCUs)) which are mounted on variety of electronic appliances. A structural example of an MCU to which the transistor described in the above embodiment is applicable is described with reference to FIG. 11.

Figure 11:
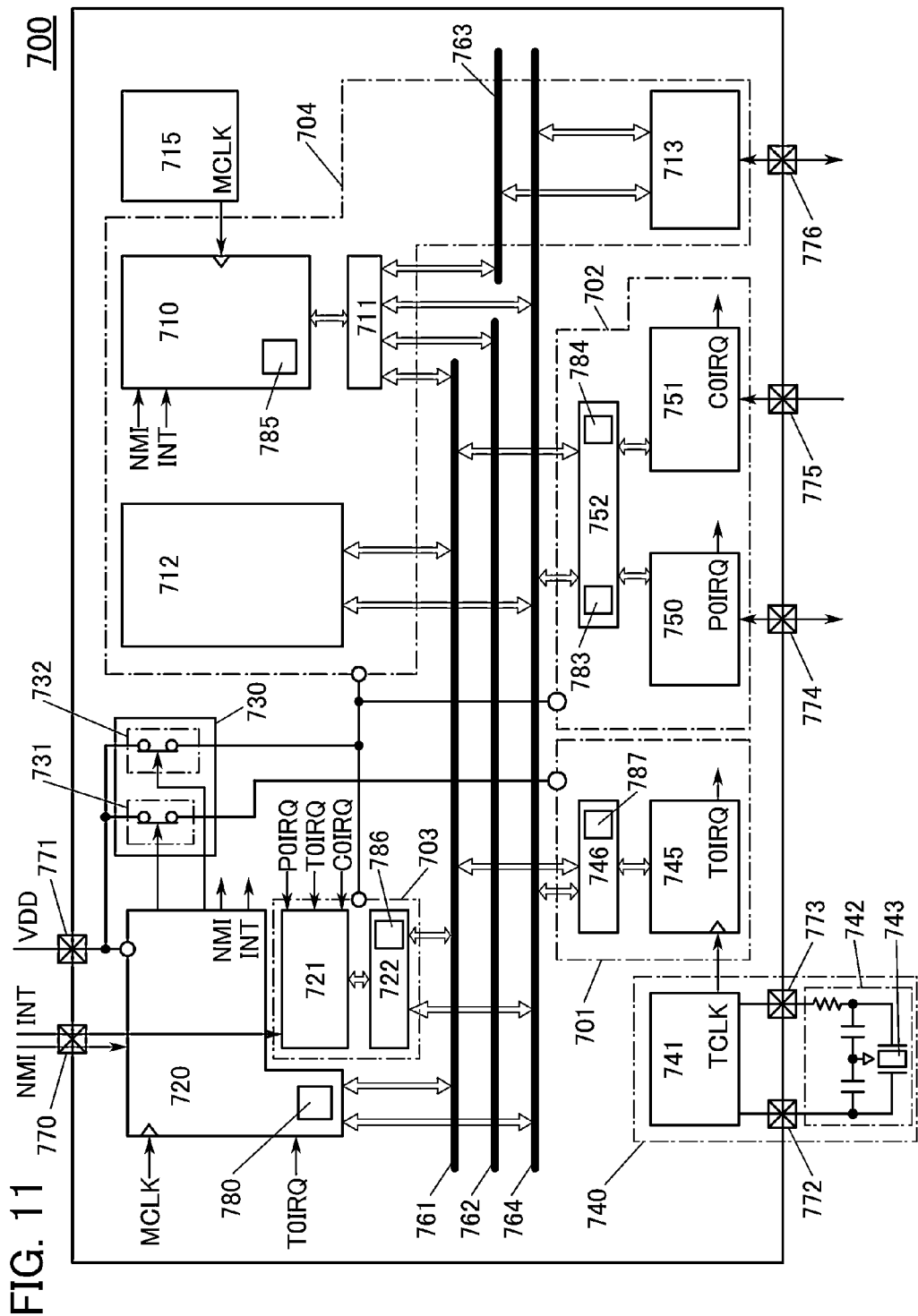
FIG. 11 is a block diagram illustrating a structural example of a MCU.

FIG. 11 is a block diagram of an MCU 700. The MCU 700 includes a CPU 710, a bus bridge 711, a RAM (random access memory) 712, a memory interface 713, a controller 720, an interrupt controller 721, an I/O interface (input-output interface) 722, and a power gate unit 730.

The MCU 700 further includes a crystal oscillation circuit 741, a timer circuit 745, an I/O interface 746, an I/O port 750, a comparator 751, an I/O interface 752, a bus line 761, a bus line 762, a bus line 763, and a data bus line 764. Further, the MCU 700 includes at least connection terminals 770 to 776 as portions for connection to an external device. Note that each of the connection terminals 770 to 776 represents one terminal or a terminal group including plural terminals. An oscillation unit 742 including a quartz crystal unit 743 is connected to the MCU 700 through the connection terminal 772 and the connection terminal 773.

The CPU 710 includes a register 785 and is connected to the bus lines 761 to 763 and the data bus line 764 through the bus bridge 711.

The RAM 712 is a memory device functioning as a main memory of the CPU 710 and is a nonvolatile random access memory. The RAM 712 is a device that stores an instruction to be executed by the CPU 710, data necessary for execution of the instruction, and data processed by the CPU 710. Under the instruction by the CPU 710, data is written into and read out from the RAM 712.

In the MCU 700 in a low power consumption mode, supply of power to the RAM 712 is blocked. Thus, the RAM 712 is made up of a nonvolatile memory that can store data when no power is supplied.

The memory interface 713 is an input-output interface with an external memory device. Under the instruction of the CPU 710, data is written into and read out from the external memory connected to the connection terminal 776 via the memory interface 713.

A clock generation circuit 715 is a circuit that generates a clock signal MCLK (hereinafter, also simply referred to as "MCLK") to be used in the CPU 710, and includes an RC oscillator and the like. MCLK is also output to the controller 720 and the interrupt controller 721.

The controller 720 is a circuit that controls the entire MCU 700, and controls, for example, a bus and a memory map; a power source of the MCU 700; the clock generation circuit 715; and the crystal oscillation circuit 741.

The connection terminal 770 is a terminal for inputting an external interrupt signal. A non-maskable interrupt signal NMI is input to the controller 720 through the connection terminal 770. As soon as the non-maskable interrupt signal NMI is input to the controller 720, the controller 720 outputs the non-maskable interrupt signal NMI to the CPU 710, so that the CPU 710 executes interrupt processing.

The interrupt signal INT is input to the interrupt controller 721 through the connection terminal 770. Interrupt signals (T0IRQ, P0IRQ, and C0IRQ) from the peripheral circuits (745, 750, and 751) are input to the interrupt controller 721 without going through the buses (761 to 764).

The interrupt controller 721 has a function of setting priorities to interrupt requests. When the interrupt controller 721 detects the interrupt signal, the interrupt controller 721 determines if the interrupt request is valid or not. If the interrupt request is valid, the interrupt controller 721 outputs an internal interrupt signal INT into the controller 720.

The interrupt controller 721 is connected to the bus line 761 and the data bus line 764 through an I/O interface 722.

When the interrupt signal INT is input, the controller 720 outputs the interrupt signal INT to the CPU 710 and makes the CPU 710 execute interrupt processing.

The interrupt signal T0IRQ is directly input to the controller 720 without going through the interrupt controller 721 in some cases. When the controller 720 receives the interrupt signal T0IRQ, the controller 720 outputs the non-maskable interrupt signal NMI to the CPU 710, so that the CPU 710 executes interrupt processing.

A register 780 of the controller 720 is provided in the controller 720. A register 786 of the interrupt controller 721 is provided in the I/O interface 722.

Then, peripheral circuits included in the MCU 700 will be described. The MCU 700 includes the timer circuit 745, the I/O port 750, and the comparator 751 as peripheral circuits. The circuits are examples of the peripheral circuits, and a circuit needed for an electronic appliance using the MCU 700 can be provided as appropriate.

The timer circuit 745 has a function of measuring time in response to a clock signal TCLK (hereinafter, also simply referred to as "TCLK") output from a clock generation circuit 740. The clock generation circuit 715 outputs the interrupt signal T0IRQ to the controller 720 and the interrupt controller 721 at predetermined intervals. The timer circuit 745 is connected to the bus line 761 and the data bus line 764 through the I/O interface 746.

TCLK is a clock signal of which frequency is lower than that of MCLK. For example, the frequency of MCLK is about several megahertz (MHz) (e.g., 8 MHz) and the frequency of MCLK is about several tens of kilohertz (kHz) (e.g., 32 kHz). The clock generation circuit 740 includes the crystal oscillation circuit 741 incorporated in the MCU 700 and the oscillation unit 742 which is connected to the connection terminal 772 and the connection terminal 773. The quartz crystal unit 743 is used as a resonator unit of the oscillation unit 742. In addition, the clock generation circuit 740 is made up of a CR oscillator and the like, and thereby, all modules in the clock generation circuit 740 can be incorporated in the MCU 700.

The I/O port 750 is an interface that inputs and outputs information to and from an external device which is connected to the I/O port 750 through the connection terminal 774 and is an input-output interface of a digital signal. The I/O port 750 outputs the interrupt signal P0IRQ to the interrupt controller 721 in accordance with an input digital signal.

The comparator 751 is a peripheral circuit that processes an analog signal inputted from the connection terminal 775. The comparator 751 compares a potential (or current) of the analog signal inputted from the connection terminal 775 with a potential (or current) of a reference signal and generates a digital signal of which the level is 0 or 1. Further, the comparator 751 generates the interrupt signal C0IRQ when the level of the digital signal is 1. The interrupt signal C0IRQ is output to the interrupt controller 721.

The I/O port 750 and the comparator 751 are connected to the bus line 761 and the data bus line 764 through the I/O interface 752 common to the both. Here, one I/O interface 752 is used because the I/O interfaces of the I/O port 750 and the comparator 751 can share a circuit; however, the I/O port 750 and the comparator 751 can have an I/O interface different from each other.

In addition, a register of each peripheral circuit is placed in the input/output interface corresponding to the peripheral circuit. A register 787 of the timer circuit 745 is placed in the I/O interface 746, and a register 783 of the I/O port 750 and a register 784 of the comparator 751 are placed in the I/O interface 752.

The MCU 700 includes the power gate unit 730 that can stop power supply to the internal circuits. Power is supplied only to a circuit necessary for operation by the power gate unit 730, so that power consumption of the whole MCU 700 can be lowered.

As illustrated in FIG. 11, circuits in a unit 701, a unit 702, a unit 703, and a unit 704 in the MCU 700 which are surrounded by dashed lines are connected to the connection terminal 771 through the power gate unit 730. The connection terminal 771 is a power source terminal for supplying a high power supply potential VDD (hereinafter, also simply referred to as VDD).

In this embodiment, the unit 701 includes the timer circuit 745, and the I/O interface 746. The unit 702 includes the I/O port 750, the comparator 751, and the I/O interface 752. The unit 703 includes the interrupt controller 721, and the I/O interface 722. The unit 704 includes the CPU 710, the RAM 712, the bus bridge 711, and the memory interface 713.

The power gate unit 730 is controlled by the controller 720. The power gate unit 730 includes a switch circuit 731 and a switch circuit 732 for blocking supply of VDD to the units 701 to 704.

The switching of the switch circuits 731 and 732 is controlled by the controller 720. Specifically, the controller 720 outputs a signal to turn off one or both of the switch circuits included in the power gate unit 730, depending on the request by the CPU 710 (power supply stop). In addition, the controller 720 outputs a signal to turn on the switch circuit included in the power gate unit 730 with, as a trigger, the non-maskable interrupt signal NMI or the interrupt signal T0IRQ from the timer circuit 745 (start of power supply).

FIG. 11 illustrates a structure where two switch circuits (the switch circuits 731 and 732) are provided in the power gate unit 730; however, the structure is not limited thereto. Switch circuits may be provided as much as needed to block supply of power.

In this embodiment, the switch circuit 731 is provided to individually control supply of power to the unit 701 and the switch circuit 732 is provided to individually control supply of power to the units 702 to 704. However, the embodiment of the present invention is not limited to such a power supply path. For example, another switch circuit which is not the switch circuit 732 may be provided to individually control supply of power to the RAM 712. Further, a plurality of switch circuits may be provided for one circuit.

In addition, VDD is constantly supplied from the connection terminal 771 to the controller 720 without going through the power gate unit 730. In order to reduce noise, a power supply potential from an external power supply circuit, which is different from the power supply circuit for VDD, is given to each of the oscillation circuit of the clock generation circuit 715 and the crystal oscillation circuit 741.

Table 1 shows roles of the blocks.

TABLE 1

| Block name | Role |
| --- | --- |
| CPU 110 | Executing instruction |
| Clock generation circuit 115 | Generating clock signal MCLK |
| Crystal oscillation circuit 141 | Generating clock signal TCLK |
| Controller 120 | Performing control processing of the whole microcontroller 100 |

TABLE 1-continued

| Block name | Role |
| --- | --- |
| Interrupt controller 121 | Setting priorities to interrupt request |
| I/O interface 146 | Inputting or outputting data |
| I/O interface 152 | Inputting or outputting data |
| I/O port 150 | An interface for connecting external device |
| Timer circuit 145 | Generating interrupt signal in accordance with timer operation |
| Comparator 151 | Comparing input signal and reference signal in potential (or current) |
| RAM 112 | A memory device functioning as main memory of CPU 110 |
| Memory interface 113 | An input-output interface with external memory device |

By provision of the controller 720, the power gate unit 730, and the like, the MCU 700 can operate in three kinds of operation modes. The first operation mode is a normal operation mode where all circuits included in the MCU 700 are active. Here, the first operation mode is referred to as "Active mode".

The second and third operation modes are low power consumption modes where some of the circuits are active. In the second operation mode, the controller 720, the timer circuit 745, and circuits (the crystal oscillation circuit 741 and the I/O interface 746) associated thereto are active. In the other of the third operation mode, the controller 720 alone is active. Here, the second operation mode is referred to as "the Noff1 mode" and the third operation mode is referred to as "the Noff2 mode".

Table 2 below shows a relation between each operation mode and active circuits. In Table 2, ON is given to circuits that are active. As shown in Table 2, the controller 720 and some of the peripheral circuits (circuits necessary for timer operation) alone operate in the Noff1 mode and the controller 720 alone operates in the Noff2 mode.

TABLE 2

|  | Active | Noff1 | Noff2 |
| --- | --- | --- | --- |
| CPU 110 | ON | — | — |
| Bus bridge 111 | ON | — | — |
| RAM 112 | ON | — | — |
| Memory interface 113 | ON | — | — |
| Clock generation circuit 115 | ON | — | — |
| Crystal oscillation circuit 141 | ON | ON | — |
| Contoller 120 | ON | ON | ON |
| Interrupt controller 121 | ON | — | — |
| I/O interface 122 | ON | — | — |
| Timer circuit 145 | ON | ON | — |
| I/O interface 146 | ON | ON | — |
| I/O port 150 | ON | — | — |
| Comparator 151 | ON | — | — |
| I/O interface 152 | ON | — | — |

Note that power is constantly supplied to the oscillator of the clock generation circuit 715 and the crystal oscillation circuit 741 regardless of the operation modes. In order to bring the clock generation circuit 715 and the crystal oscillation circuit 741 into non-Active modes, an enable signal is inputted from the controller 720 or an external circuit to stop oscillation of the clock generation circuit 715 and the crystal oscillation circuit 741.

In addition, in Noff1 and Noff2 modes, power supply is stopped by the power gate unit 730, so that the I/O port 750 and the I/O interface 752 are non-active, but power is supplied to parts of the I/O port 750 and the I/O interface 752 in order to allow the external device connected to the connection terminal 774 to operate normally. Specifically, power is supplied to an output buffer of the I/O port 750 and the register 786 of the I/O port 750. In the Noff1 and Noff2 modes, actual functions of the I/O port 750, that is, functions of data transmission between the I/O interface 752 and the external device and generation of an interrupt signal, are stopped. In addition, a communication function of the I/O interface 752 is also stopped similarly.

Note that in this specification, the phrase "a circuit is non-active" includes a state where major functions in Active mode (normal operation mode) are stopped and an operation state with power consumption lower than that of Active mode, as well as a state that a circuit is stopped by blocking supply of power.

Further, in order that the MCU 700 can return from the Noff1 or Noff2 mode to Active mode more rapidly, the registers 784 to 787 each have a backup storage portion for saving data at the time of power supply stop. In other words, the registers 784 to 787 each include a volatile data storage portion (also simply referred to as volatile memory unit) and a nonvolatile data storage portion (also simply referred to as nonvolatile memory unit). In Active mode, by accessing the volatile memory units of the registers 784 to 787, data is written and read out.

Note that since power is always supplied to the controller 720, the register 780 of the controller 720 is not provided with a nonvolatile memory unit. In addition, as described above, even in the Noff1 or Noff2 mode, the register 783 operates so that the output buffer of the I/O port 750 functions. Since power is always supplied to the register 783, the register 783 is not provided with a nonvolatile memory unit.

A volatile memory unit includes one or more of volatile memory elements. A nonvolatile memory unit includes one or more of nonvolatile memory elements. Note that the volatile memory element shows access speed higher than that of the nonvolatile memory element.

A semiconductor material used for a transistor included in the volatile memory element is not particularly limited. However, the semiconductor material preferably has a band gap width different from that of a semiconductor material used for a transistor included in the nonvolatile memory element to be described later. As such a semiconductor material, silicon, germanium, silicon germanium, gallium arsenide, or the like can be used, and a single crystal semiconductor is preferably used. In order to increase the speed of processing data, it is preferable to use, for example, a transistor with high switching speed, such as a transistor formed using single crystal silicon.

The nonvolatile memory element is electrically connected to a node holding electric charge corresponding to data of the volatile memory element and is used for storing data from the volatile memory element in a period during which power is not supplied. Accordingly, the nonvolatile memory element has a longer data retention time than at least the volatile memory element to which power is not supplied.

In the shift from Active mode to Noff1 or Noff2 mode, prior to power supply stop, data stored in the volatile memories of the registers 784 to 787 are written into the nonvolatile memories, so that data in the volatile memories are reset to initial values; as a result, supply of power is blocked.

In the return from Noff1 or Noff2 mode to Active mode, when power is supplied again to the registers 784 to 787, data in the volatile memories are reset to initial values. Then, data in the nonvolatile memories are written into the volatile memories.

Accordingly, even in the low power consumption mode, data needed for processing of the MCU 700 are stored in the registers 784 to 787, and thus, the MCU 700 can return from the low power consumption mode to Active mode immediately.

[5-1-2. Structural Example of Register]

Figure 12:
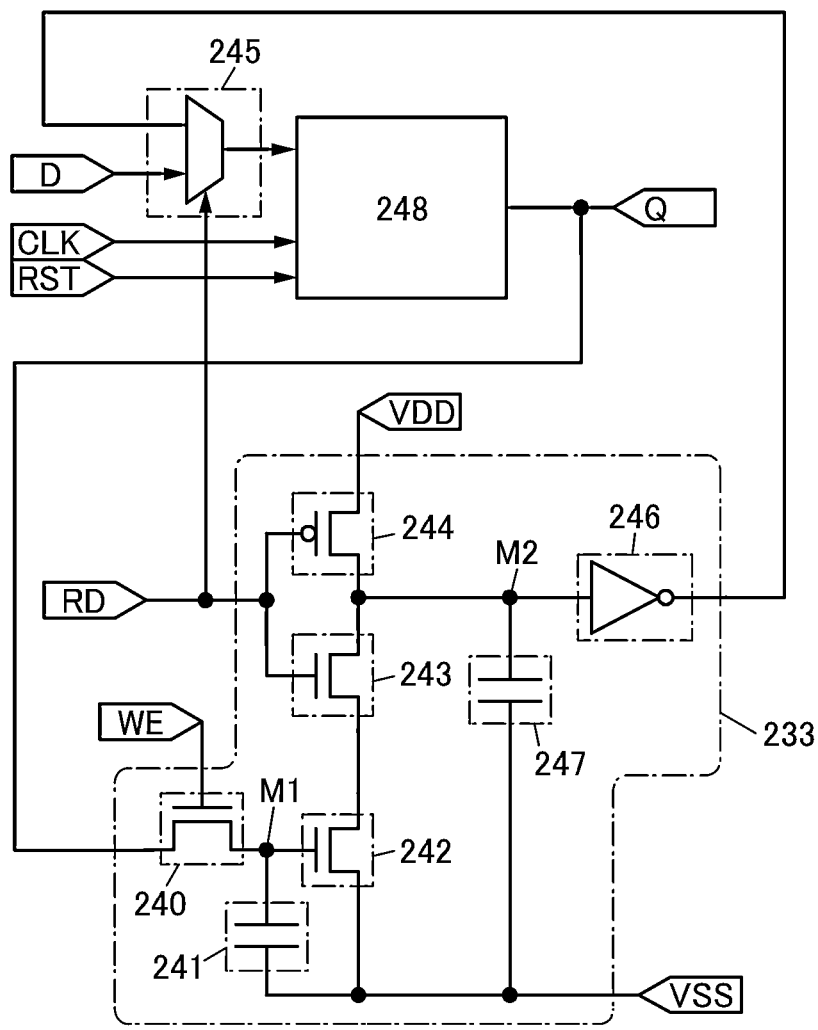
FIG. 12 is a circuit diagram illustrating an example of a register including a nonvolatile memory unit.

FIG. 12 shows a register 1196 as one example of a circuit structure that can be used for the registers 784 to 787. The circuit structure includes a volatile memory unit and a nonvolatile memory unit and can store 1-bit data.

The register 1196 illustrated in FIG. 12 includes a flip-flop 248 which is a volatile memory unit, a nonvolatile memory unit 233, and a selector 245.

The flip-flop 248 is supplied with a reset signal RST, a clock signal CLK, and a data signal D. The flip-flop 248 has a function of holding data of a data signal D that is input in accordance with the clock signal CLK and outputting a high-level potential H or a low-level potential L as a data signal Q in accordance with the data signal D.

The nonvolatile memory unit 233 is supplied with a write control signal WE, a read control signal RD, and a data signal D.

The nonvolatile memory unit 233 has a function of storing data of an input data signal D in accordance with the write control signal WE and outputting the stored data as the data signal D in accordance with the read control signal RD.

The selector 245 selects the data signal D or the data signal output from the nonvolatile memory unit 233 and inputs the selected signal to the flip-flop 248 in accordance with the read control signal RD.

Further, as illustrated in FIG. 12, a transistor 240 and a capacitor 241 are provided in the nonvolatile memory unit 233.

The transistor 240 is an n-channel transistor. One of a source and a drain of the transistor 240 is electrically connected to an output terminal of the flip-flop 248. The transistor 240 has a function of controlling holding a data signal output from the flip-flop 248 in accordance with the write control signal WE.

The transistor 240 preferably has extremely low off-state current. For example, a transistor which includes an oxide semiconductor for a semiconductor layer where a channel is formed is used as the transistor 240. Specifically, for example, the transistor described in the above embodiment can be used.

One of a pair of electrodes of the capacitor 241 and the other of the source and the drain of the transistor 240 are connected to a node M1. A low power source potential VSS (hereinafter, simply referred to as "VSS") is applied to the other of the pair of the electrodes of the capacitor 241. The capacitor 241 has a function of holding electric charge based on data of the stored data signal D in the node M1. The transistor 240 preferably has extremely low off-state current. Since a transistor having an extremely low off-state current is used for the transistor 240, the electric charge in the node M1 is held and thus the data is held even when supply of the power supply voltage is stopped. By using a transistor having an extremely low off-state current for the transistor 240, the capacitor 241 can be small or omitted.

A transistor 244 is a p-channel transistor. A high power source potential VDD is supplied to one of a source and a drain of the transistor 244. The read control signal RD is input to the gate electrode of the transistor 244.

The transistor 243 is an n-channel transistor. One of a source and a drain of the transistor 243 and the other of the source and the drain of the transistor 244 are connected to a node M2. A gate of the transistor 243 is connected to a gate of the transistor 244 and the read control signal RD is input to the gate of the transistor 243.

A transistor 242 is an n-channel transistor. One of a source and a drain of the transistor 242 is connected to the other of the source and the drain of the transistor 243. A power source potential VSS is supplied to the other of the source and the drain of the transistor 242. Note that a high-level potential H which the flip-flop 248 outputs is a potential at which the transistor 242 is turned on, and a low-level potential L which the flip-flop 248 outputs is a potential at which the transistor 242 is turned off.

An input terminal of an inverter 246 is connected to the node M2. In addition, an output terminal of the inverter 246 is connected to an input terminal of the selector 245.

One of the electrodes of a capacitor 247 is connected to the node M2. A power source potential VSS is supplied to the other of the electrodes of the capacitor 247. The capacitor 247 has a function of holding electric charge based on data of a data signal input to the inverter 246.

In the register 1196 having the above-described structure in FIG. 12, when data is stored from the flip-flop 248 to the nonvolatile memory unit 233, the transistor 240 is turned on by inputting a signal for turning on the transistor 240 as the write control signal WE, so that electric charge corresponding to the data signal Q in the flip-flop 248 is supplied to the node M1. After that, by turning off the transistor 240 by inputting a signal for turning off the transistor 240 as the write control signal WE, electric charge supplied to the node M1 is held. While VSS is supplied as the potential of the read control signal RD, the transistor 243 is turned off and the transistor 244 is turned on, so that the potential of the node M2 becomes VDD.

When data is restored from the nonvolatile memory unit 233 to the flip-flop 248, VDD is applied as the read control signal RD. Accordingly, the transistor 244 is turned off and the transistor 243 is turned on, so that a potential based on the electric charge held in the node M1 is supplied to the node M2. In the case where electric charge corresponding to the high potential H of the data signal Q is held in the node M1, the transistor 242 is turned on, VSS is supplied to the node M2, and VDD output from the inverter 246 is input to the flip-flop 248 through the selector 245. Alternatively, in the case where electric charge corresponding to the low potential L of the data signal Q is held in the node M1, the transistor 242 is turned off, the potential (VDD) of the node M2 when VSS is supplied is held as the potential of the read control signal RD, and VSS output from the inverter 246 is input to the flip-flop 248 through the selector 245.

By provision of the volatile memory unit 232 and the nonvolatile memory unit 233 in the register 1196 as described above, data can be stored from the volatile memory unit 232 in the nonvolatile memory unit 233 before supply of power to the CPU 230 is stopped and data can be quickly restored from the nonvolatile memory unit 233 to the volatile memory unit 232 when the supply of power to the CPU 230 is resumed.

By storing and restoring data in such a manner, the CPU 230 does not need to be started up from a state where the volatile memory unit 232 is initialized every time the supply of power is stopped; thus, after the supply of power is resumed, the CPU 230 can start arithmetic processing relating to measurement immediately.

Note that in order to increase the speed of reading data, it is preferable to use a transistor that is similar to the transistor used for the volatile memory element as the transistor 242.

Note that in the register 1196, VSS is supplied to the other of the source and the drain of the transistor 242 and the other of the electrodes of the capacitor 241. However, the other of the source and the drain of the transistor 242 and the other of the electrodes of the capacitor 241 may have the same potential or different potentials. Further, the capacitor 241 is not needed to be provided. For example, in the case where the parasitic capacitance of the transistor 242 is high, the parasitic capacitance can be used instead of the capacitor 241.

The node M1 has the same effect as a floating gate of a floating-gate transistor that is used as a nonvolatile memory element. However, since data can be directly rewritten by turning on or off the transistor 240, injection of electric charge into a floating gate and extraction of electric charge from the floating gate with the use of high voltage are not necessary. In other words, in the nonvolatile memory unit 233, high voltage needed for writing or erasing data in a conventional floating gate transistor is not necessary. Thus, by using the nonvolatile memory unit 233 in this embodiment, power consumption needed for storage of data can be reduced.

For similar reasons, a decrease in operation speed due to data writing or data erasing can be reduced; thus, the nonvolatile memory unit 233 can operate at high speed. For the same reason, deterioration of a gate insulating layer (tunnel insulating layer), which is a problem of a conventional floating gate transistor, does not exist. In other words, unlike in a conventional floating gate transistor, the nonvolatile memory unit 233 described in this embodiment has no limitation on the number of writings in principle. From the above, the nonvolatile memory unit 233 can be adequately used as a memory device that needs many rewritings and high-speed operation, such as a register.

In the above, the structure of the nonvolatile memory unit 233 is not limited to the structures in FIG. 12. For example, a phase change memory (PCM), a resistance random access memory (ReRAM), a magnetoresistive random access memory (MRAM), a ferroelectric random access memory (FeRAM), or a flash memory can be used.

Volatile memory elements can be included in, for example, a register such as a buffer register or a general-purpose register. A cache memory including a static random access memory (SRAM) or the like can also be provided in the volatile memory unit. The register and cache memory can store data in the nonvolatile memory unit 233.

[5-1-3. Structural Example of Semiconductor Device Applicable to MCU]

An example of a structure of a semiconductor device which can be applied to an MCU using a nonvolatile memory unit is described with reference to a cross-sectional view of FIG. 13.

Figure 13:
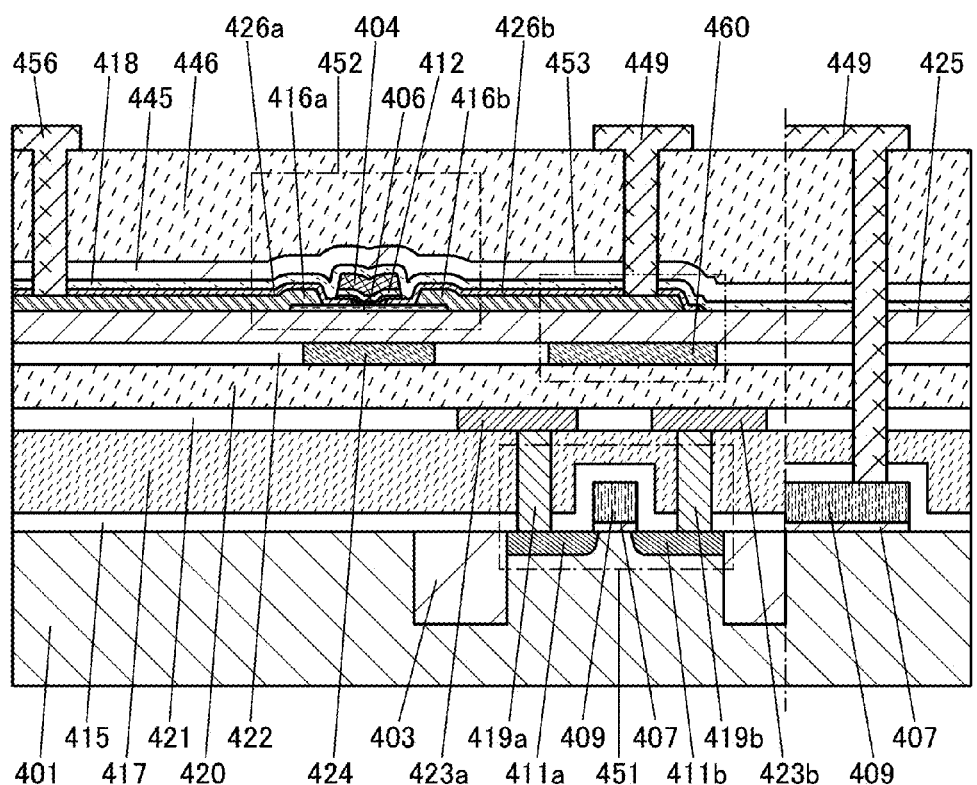
FIG. 13 illustrates an example of a semiconductor device.

A semiconductor device illustrated in FIG. 13 includes an element separation layer 403 and an n-channel transistor 451. The element separation layer 403 is formed in a p-type semiconductor substrate 401. The n-channel transistor 451 includes a gate insulating layer 407, a gate electrode 409, an n-type impurity region 411a, and an n-type impurity region 411b. An insulating layer 415 and an insulating layer 417 are provided over the transistor 451.

In the semiconductor substrate 401, the transistor 451 is separated from other semiconductor elements (not illustrated) by the element separation layer 403. The element separation layer 403 can be formed by a local oxidation of silicon (LOCOS) method, a shallow trench isolation (STI) method, or the like.

Note that in the transistor 451, sidewall insulating layers may be formed on side surfaces of the gate electrode 409, and a region whose impurity concentration is different from those of the n-type impurity region 411a and the n-type impurity region 411b may be provided in the n-type impurity region 411a and the n-type impurity region 411b.

In openings formed by selectively etching parts of the insulating layer 415 and the insulating layer 417, a contact plug 419a and a contact plug 419b are formed. An insulating layer 421 is provided over the insulating layer 417, the contact plug 419a, and the contact plug 419b. The insulating layer 421 includes a groove portion at least partly overlapping the contact plug 419a and a groove portion at least partly overlapping the contact plug 419b.

A wiring 423a is formed in the groove portion at least partly overlapping the contact plug 419a. A wiring 423b is formed in the groove portion at least partly overlapping the contact plug 419b. The wiring 423a is connected to the contact plug 419a. The wiring 423b is connected to the contact plug 419b.

An insulating layer 420 formed by a sputtering method, a CVD method, or the like is provided over the insulating layer 421, the wiring 423a, and the wiring 423b. Further, an insulating layer 422 is formed over the insulating layer 420. The insulating layer 422 includes a groove portion at least partly overlapping with a stack 406 including an oxide semiconductor layer and a groove portion at least partly overlapping with a first drain electrode 416b or a second drain electrode 426b.

An electrode 424 functioning as a back gate electrode of a transistor 452 is formed in the groove portion at least partly overlapping with the stack 406, which is included in the insulating layer 422. By providing the electrode 424, threshold voltage of the transistor 452 can be controlled.

An electrode 460 is formed in the groove portion at least partly overlapping the first drain electrode 416b or the second drain electrode 426b, which is included in the insulating layer 422.

An insulating layer 425 formed by a sputtering method, a CVD method, or the like is provided over the insulating layer 422, the electrode 424, and the electrode 460. The transistor 452 is provided over the insulating layer 425.

As the transistor 452, any of the transistors described in the above embodiments can be used. A change in the electric characteristics of any of the transistors described in the above embodiment is suppressed and thus the transistors are electrically stable. Accordingly, a semiconductor device with high reliability can be provided as the semiconductor device of this embodiment in FIG. 13.

Note that FIG. 13 illustrates the case where a transistor having a structure similar to that of the transistor 300 described in the above embodiment is used as the transistor 452.

The transistor 452 includes the stack 406 formed over the insulating layer 425; a first source electrode 416a and the first drain electrode 416b; a second source electrode 426a and the second drain electrode 426b which are formed over the first source electrode 416a and the first drain electrode 416b; a gate insulating layer 412; and a gate electrode 404. In addition, an insulating layer 418, an insulating layer 445, and an insulating layer 446 which cover the transistor 452 are provided. Over the insulating layer 446, a wiring 449 which is connected to the first drain electrode 416b and a wiring 456 which is connected to the first source electrode 416a are provided. The wiring 449 functions as a node at which the drain electrode of the transistor 452 is electrically connected to the gate electrode 409 of the n-channel transistor 451.

In this embodiment, the structure where the wiring 449 is connected to the first drain electrode 416b is described;

however, the structure is not limited thereto. For example, the wiring 449 may be connected to the second drain electrode 426*b*. Further, the structure where the wiring 456 is connected to the first source electrode 416*a* is shown; however, the structure is not limited thereto. For example, the wiring 456 may be connected to the second source electrode 426*a*.

A part where the first drain electrode 416*b* and the electrode 460 overlap with the oxide insulating layer 425 laid therebetween or a part where the second drain electrode 426*b* and the electrode 460 overlap with the insulating layer 425 laid therebetween functions as a capacitor 453. For example, VSS is supplied to the electrode 460.

Note that the capacitor 453 is not necessarily provided. For example, in the case where parasitic capacitance of the n-channel transistor 451 or the like is sufficiently large, a structure without the capacitor 453 may be employed.

The transistor 452 corresponds to the transistor 240 illustrated in FIG. 12, for example. The transistor 451 corresponds to the transistor 242 illustrated in FIG. 12, for example. The capacitor 453 corresponds to the capacitor 241 illustrated in FIG. 12, for example. The wiring 449 corresponds to the node M1 illustrated in FIG. 12, for example.

Here, the transistor 451 is formed using a semiconductor other than an oxide semiconductor, such as single crystal silicon, so that the transistor can operate at a sufficiently high speed. Thus, when the transistor is used as a reading transistor, information can be read at a high speed.

As described in this embodiment, the transistor 452 is preferably a transistor showing an extremely low off-state current. In this embodiment, a transistor including an oxide semiconductor is described as an example of a transistor showing an extremely low off-state current. With such a structure, the potential of the node M1 can be held for a long time.

<5-2. Display Device>

The transistor described in the above embodiment can be used for a display device. Moreover, some or all of driver circuits which include the transistor described in the above embodiment can be formed over a substrate where a pixel portion is formed, whereby a system-on-panel can be obtained. Structural examples of a display device to which the transistor described in the above embodiment can be used are described with reference to FIGS. 14A to 14C, FIGS. 15A and 15B, FIGS. 16A and 16B, and FIGS. 17A to 17C.

As a display element provided in the display device, a liquid crystal element (also referred to as a liquid crystal display element), a light-emitting element (also referred to as a light-emitting display element) or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. A display device including a liquid crystal element and a display device including an EL element are described below as examples of the display device.

[5-2-1. Liquid Crystal Display Device and EL Display Device]

Figure 14A:
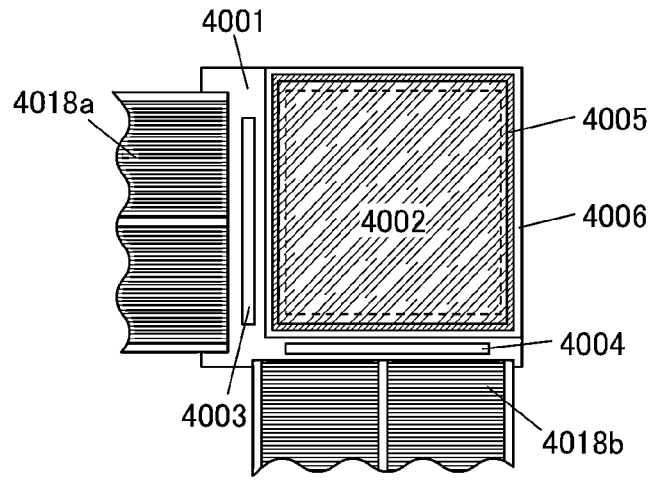
FIGS. 14A to 14C each illustrate an example of a display device.

In FIG. 14A, a sealant 4005 is provided so as to surround a pixel portion 4002 provided over a first substrate 4001, and the pixel portion 4002 is sealed with a second substrate 4006. In FIG. 14A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018*a* and 4018*b*.

Figure 14B:
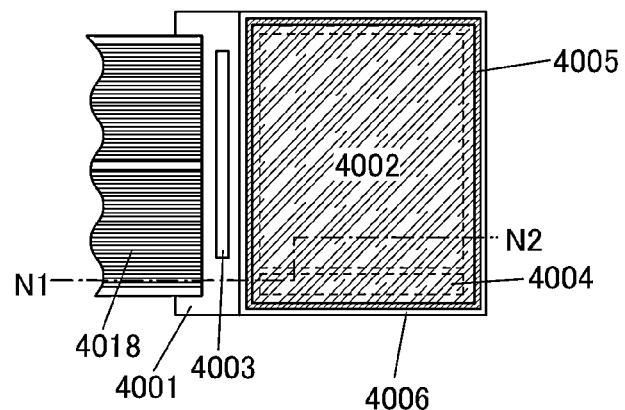
Figure 14C:
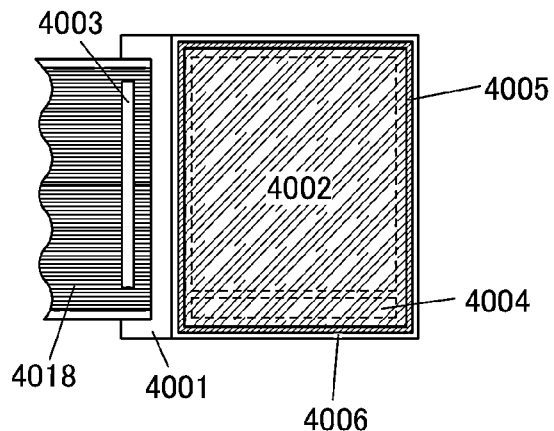

In FIGS. 14B and 14C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Hence, the pixel portion 4002 and the scan line driver circuit 4004 are sealed together with the display element, by the first substrate 4001, the sealant 4005, and the second substrate 4006. Further, in FIGS. 14B and 14C, the signal line driver circuit 4003 which is formed using a single crystal semiconductor or a polycrystalline semiconductor over another substrate is mounted in a region that is different from the region surrounded by the sealant 4005 over the first substrate 4001. In FIGS. 14B and 14C, various signals and potentials are supplied to the signal line driver circuit 4003, the scan line driver circuit 4004, and the pixel portion 4002 through an FPC 4018.

Although FIGS. 14B and 14C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or only part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 14A illustrates an example in which the signal line driver circuit 4003 and the scan line driver circuit 4004 are mounted by a COG; FIG. 14B illustrates an example in which the signal line driver circuit 4003 is mounted by a COG; FIG. 14C illustrates an example in which the signal line driver circuit 4003 is mounted by a TCP.

The display device encompasses a panel in which a liquid crystal display element is sealed, and a module in which an IC or the like including a controller is mounted on the panel.

The display device in this specification refers to an image display device or a light source (including a lighting device). Further, the display device also includes the following modules in its category: a module to which a connector such as an FPC or a TCP is attached; a module having a TCP or the like at the tip of which a printed wiring board is provided; and a module in which an integrated circuit (IC) is directly mounted on a display element by a COG.

The pixel portion and the scan line driver circuit provided over the first substrate include a plurality of transistors to which the transistor which is described in the above embodiment can be applied.

As the display element provided in the display device, a liquid crystal element (also referred to as a liquid crystal display element) or a light-emitting element (also referred to as a light-emitting display element) can be used. The light-emitting element includes in its category an element whose luminance is controlled by a current or a voltage, and specifically encompasses an inorganic EL element, an organic EL element, and the like. Besides those, display medium whose contrast is changed by an electric effect, such as electronic ink, can also be used.

FIGS. 15A and 15B correspond to cross-sectional views taken along chain line N1-N2 in FIG. 14B. As shown in FIGS. 15A and 15B, the semiconductor device has an electrode 4015, and the electrode 4015 is electrically connected to a terminal included in the FPC 4018 through an anisotropic conductive layer 4019. The electrode 4015 is electrically connected to a wiring 4014 through an opening formed in an insulating layer 4020.

The electrode 4015 is formed of the same conductive layer as a first electrode layer 4030, and the wiring 4014 is formed of the same conductive layer as a source and drain electrodes of transistors 4010 and 4011.

In FIG. 15A, the electrode 4015 and the wiring 4014 are connected to each other in the opening formed in the insulating layer 4020, and in FIG. 15B, the electrode 4015 and the wiring 4014 are connected to each other in a plurality of openings formed in the insulating layer 4020. Since the surface of the electrode 4015 is uneven due to the plurality of openings, the area of contact between the electrode 4015 to be formed later and the anisotropic conductive layer 4019 can be increased. Thus, favorable connection of the FPC 4018 and the electrode 4015 can be obtained.

The pixel portion 4002 and the scan line driver circuit 4004 provided over the first substrate 4001 include a plurality of transistors. In FIGS. 15A and 15B, the transistor 4010 included in the pixel portion 4002 and the transistor 4011 included in the scan line driver circuit 4004 are shown as an example. The insulating layer 4020 is provided over the transistors 4010 and 4011 in FIG. 15A, and a planarization layer 4021 is further provided over the insulating layer 4020 in FIG. 15B. An insulating layer 4023 is an insulating layer which functions as a base layer.

In this embodiment, the transistor described in the above embodiment can be applied to the transistor 4010, 4011.

A change in the electric characteristics of the transistor described in the above embodiment is suppressed, and thus the transistor is electrically stable. Accordingly, the semiconductor device of this embodiment illustrated in FIGS. 15A and 15B can be a highly reliable semiconductor device.

FIG. 15A illustrates the case where a transistor having a structure similar to that of the transistor 300 described in the above embodiment is used as each of the transistors 4010 and 4011. FIG. 15B illustrates the case where a transistor having a structure similar to that of the transistor 300 described in the above embodiment is used as the transistor 4011.

FIG. 15B illustrates the structural example in which a conductive layer 4017 is provided so as to overlap with a channel formation region of the oxide semiconductor layer of the transistor 4011 for the driver circuit with the insulating layer 4023 positioned therebetween. The conductive layer 4017 can function as a back gate electrode.

The transistor 4010 included in the pixel portion 4002 is electrically connected to the display element to constitute part of a display panel. A variety of display elements can be used as the display element as long as display can be performed.

An example of a liquid crystal display device using a liquid crystal element as a display element is illustrated in FIG. 15A. In FIG. 15A, a liquid crystal element 4013 which is the display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031. A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is not involved may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 vol. % or more of a chiral material is mixed is used for the liquid crystal layer in order to widen the temperature range. The liquid crystal composition which includes the liquid crystal exhibiting a blue phase and a chiral material has a short response time of 1 msec or less, and has optical isotropy, which makes the alignment process unnecessary and the viewing angle dependence small. In addition, since an alignment film is not involved and thus rubbing treatment is unnecessary, electrostatic discharge damage caused by the rubbing treatment can be prevented, so that defects and damage of the liquid crystal display device in the manufacturing process can be reduced. Thus, productivity of the liquid crystal display device can be increased. A transistor using an oxide semiconductor layer has a possibility that the electric characteristics may change significantly by the influence of static electricity to deviate from the designed range. Therefore, it is more effective to use a liquid crystal material exhibiting a blue phase for the liquid crystal display device including the transistor using the oxide semiconductor layer.

The inherent resistance of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. The inherent resistance in this specification is measured at 20° C.

In the transistor used in this embodiment, which uses a highly-purified oxide semiconductor layer, the current in an off state (the off-state current) can be made small. Accordingly, an electrical signal such as an image signal can be held for a longer period in the pixel, and a writing interval can be set longer in an on state. Accordingly, frequency of refresh operation can be reduced, which leads to an effect of suppressing power consumption.

The magnitude of a storage capacitor provided in the liquid crystal display device is set considering the leakage current of the transistor in the pixel portion or the like so that electric charge can be held for a predetermined period. The magnitude of the storage capacitor may be set considering the off-state current of the transistor or the like. Since the transistor including a highly purified oxide semiconductor layer is used, it is enough to provide a storage capacitor having a capacitance that is less than or equal to ⅓, preferably less than or equal to ⅕ of the liquid crystal capacitance of each pixel.

In the transistor including the above oxide semiconductor, relatively high field-effect mobility can be obtained, whereby high-speed operation is possible. Consequently, when the above transistor is used in a pixel portion of a semiconductor device having a display function, high-quality images can be obtained. Since a driver circuit portion and the pixel portion can be formed over one substrate with the use of the above transistor, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Above all, a normally black liquid crystal panel such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an Advanced Super View (ASV) mode, and the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be applied with a polarizing substrate and a retardation substrate. In addition, a backlight, a side light, or the like may be used as a light source.

As a display method in the pixel portion, a progressive method, an interlace method, or the like can be employed. Further, color elements controlled in each pixel for color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the size of the display region may be different between respective dots of color elements. One embodiment of the present invention can be applied not only to a display device for color display, but also to a display device for monochrome display.

Further, a light-emitting element utilizing electroluminescence can alternatively be used as the display element in the display device. Light-emitting elements utilizing electroluminescence are classified according to whether the light-emitting material is an organic compound or an inorganic compound; in general, the former is referred to as an organic EL element, and the latter is referred to as an inorganic EL element.

In an organic EL element, by application of voltage to the light-emitting element, electrons and holes are separately injected from a pair of electrodes into a layer containing the light-emitting organic compound, and current flows. Then, the carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. On the other hand, the thin-film inorganic EL element has a structure where a light-emitting layer is sandwiched between dielectric layers, which is further sandwiched between electrodes, and its light emission mechanism is localized type light emission that utilizes inner-shell electron transition of metal ions. An example in which an organic EL element is used as the light-emitting element is described here.

In order to extract light emitted from the light-emitting element, at least one of the pair of electrodes is transparent. The transistor and the light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the side opposite to the substrate and the substrate side.

FIG. 15B illustrates an example of an EL display device (also referred to as a "light-emitting device") using a light-emitting element as a display element. A light-emitting element 4513 which is the display element is electrically connected to the transistor 4010 in the pixel portion 4002. The structure of the light-emitting element 4513 is the stacked-layer structure including the first electrode layer 4030, an electroluminescent layer 4511, and the second electrode layer 4031; however, this embodiment is not limited to this structure. The structure of the light-emitting element 4513 can be changed as appropriate depending on the direction in which light is extracted from the light-emitting element 4513, or the like.

A bank 4510 can be formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The electroluminescent layer 4511 consists of either a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is confined by the first substrate 4001, the second substrate 4006, and the sealant 4005, a filler 4514 is provided for sealing. It is preferable that the panel be packaged (sealed) with a protective film (such as a laminate film or an ultraviolet curable resin film) or a cover member with high air-tightness and little degasification so that the panel is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, a polyimide resin, an epoxy resin, a silicone resin, polyvinyl butyral (PVB), ethylene vinyl acetate (EVA), or the like can be used. For example, nitrogen is used for the filler.

In addition, if necessary, an optical film, such as a polarizing plate, a circularly polarizing plate (including an elliptically polarizing plate), a retardation plate (a quarter-wave plate or a half-wave plate), or a color filter, may be provided as appropriate on a light-emission surface of the light-emitting element. Further, the polarizing plate or the circularly polarizing plate may be provided with an anti-reflection film. For example, anti-glare treatment by which reflected light can be diffused by unevenness of the surface so as to reduce the glare can be performed.

The first electrode layer and the second electrode layer (each of which is also called a pixel electrode layer, a common electrode layer, a counter electrode layer, or the like) for applying voltage to the display element each have either a light-transmitting property or a light-reflecting property, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called a conductive polymer) can also be used for any of the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protective circuit for protecting the driver circuit is preferably provided. The protection circuit is preferably formed using a nonlinear element.

As described above, by applying the transistor described in the above embodiment, a highly reliable semiconductor device having a display function can be provided. With the use of any of the wiring structures described in the above embodiment, wiring resistance can be reduced without an increase in width or thickness of the wiring. Thus, a semiconductor device which has high integration, a large size, and a display function with high display quality can be provided. Further, a semiconductor device with low power consumption can be provided.

[5-2-2. Example of Pixel Circuit]

Figure 16A:
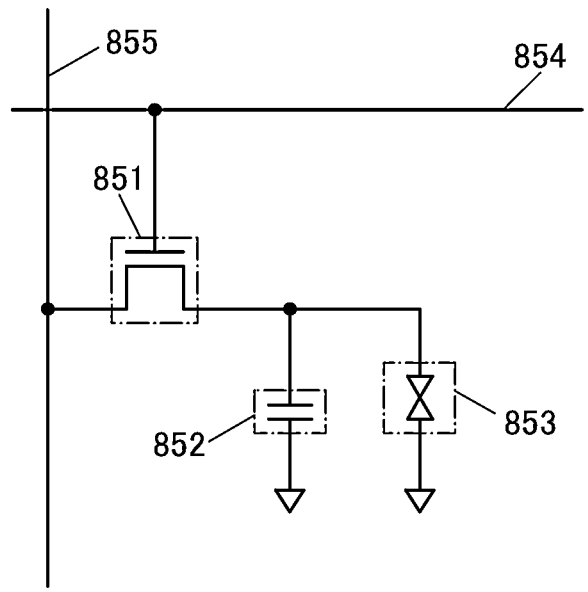
FIGS. 16A and 16B each illustrate an example of a pixel circuit which can be used for a display device.
Figure 16B:
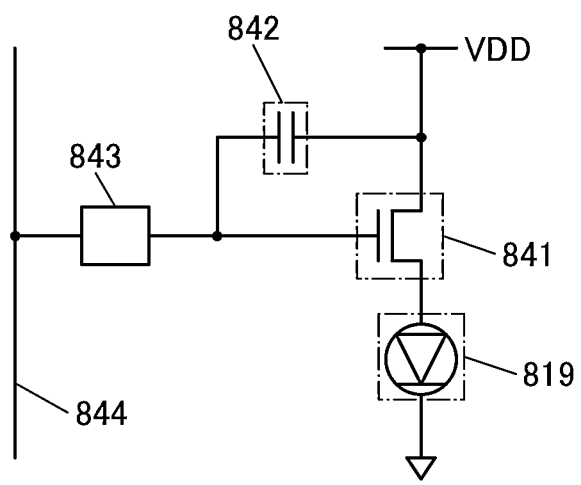

FIGS. 16A and 16B illustrate examples of a pixel circuit applicable to a display device. FIG. 16A is a circuit diagram of an example of a pixel circuit applicable to a liquid crystal display device. The pixel circuit illustrated in FIG. 16A includes a transistor 851, a capacitor 852, and a liquid crystal element 853 in which a space between a pair of electrodes is filled with a liquid crystal.

One of a source and a drain of the transistor 851 is electrically connected to a signal line 855, and a gate of the transistor 851 is electrically connected to a scan line 854.

One of electrodes of the capacitor 852 is electrically connected to the other of the source and the drain of the transistor 851, and the other of the electrodes of the capacitor 852 is electrically connected to a wiring for supplying a common potential.

One of electrodes of the liquid crystal element 853 is electrically connected to the other of the source and the drain of the transistor 851, and the other of the electrodes of the liquid crystal element 853 is electrically connected to a wiring for supplying a common potential. Note that the common potential supplied to the wiring electrically connected to the other of the electrodes of the capacitor 852 may be different from the common potential supplied to the wiring electrically connected to the other of the electrodes of the liquid crystal element 853.

FIG. 16B is a circuit diagram of an example of a pixel circuit applicable to an EL display device.

The pixel circuit in FIG. 16B includes a switching element 843, a transistor 841, a capacitor 842, and a light-emitting element 719.

A gate of the transistor 841 is electrically connected to one terminal of the switching element 843 and one terminal of the capacitor 842. A source of the transistor 841 is electrically connected to one terminal of the light-emitting element 719. A drain of the transistor 841 is electrically connected to the other terminal of the capacitor 842 and is supplied with a high power supply potential VDD. The other terminal of the switching element 843 is electrically connected to a signal line 844. The other terminal of the light-emitting element 719 has a potential which is smaller than the high power supply potential VDD, e.g., a lower power supply potential VSS or a ground potential GND.

Further, a ground potential GND can be used as the high power supply potential VDD or the low power supply potential VSS. For example, in the case where a ground potential GND is used as the high power supply potential VDD, the low power supply potential VSS is voltage lower than the ground potential, and in the case where a ground potential GND is used as the low power supply potential VSS, the high power supply potential VDD is voltage higher than the ground potential GND.

Note that as the transistor 841, the above-described transistor including the stack including the oxide semiconductor layer is used. The transistor has stable electrical characteristics. Thus, the EL display device can have high display quality.

As the switching element 843, a transistor is preferably used. When the transistor is used as the switching element, the area of a pixel can be reduced, so that the EL display device can have high resolution. Alternatively, the above-described transistor including the stack including the oxide semiconductor layer may be used as the switching element 843. When the transistor is used as the switching element 843, the switching element 843 can be formed in the same process as the transistor 841, so that the productivity of the EL display device can be improved.

<5-3. Electronic Appliances>

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, medical equipment such as dialyzers, detectors detecting fire, smoke, electric leakage, gas leakage, or the like, and various sensors such as proximity sensors, infrared sensors, vibration sensors, radiation sensors, and human sensors. Further, the examples include industrial equipment such as guide lights, traffic lights, belt conveyors, elevators, escalators, industrial robots, and power storage systems. In addition, moving objects driven by oil engines and electric motors using power from the non-aqueous secondary batteries, and the like are also included in the category of electric appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of the electronic appliances are illustrated in FIGS. 17A to 17C.

Figure 17A:
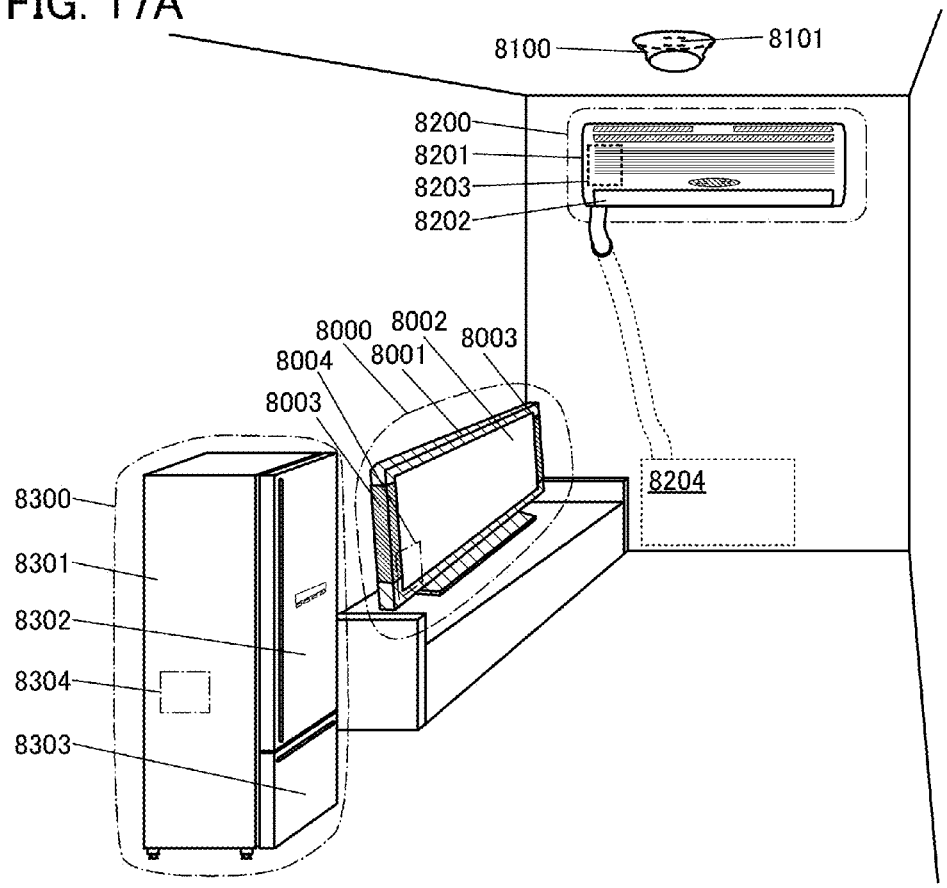
FIGS. 17A to 17C each illustrate an example of an electronic appliance.
Figure 17B:
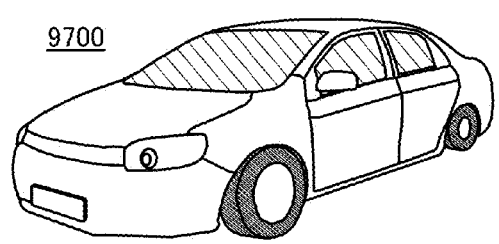
Figure 17C:
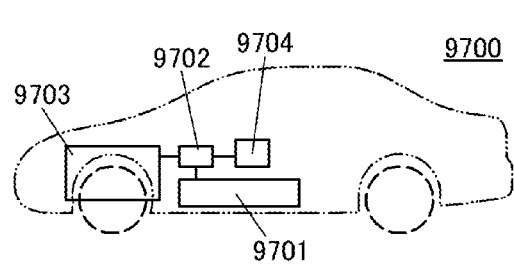

In FIG. 17A, an alarm system 8100 is a residential fire alarm, which includes a sensor portion and an MCU 8101. The transistor described in the above embodiment can be used for the MCU 8101.

In FIG. 17A, a CPU that uses the transistor described in the above embodiment is included in an air conditioner which includes an indoor unit 8200 and an outdoor unit 8204. Specifically, the indoor unit 8200 includes a housing 8201, an air outlet 8202, an MCU 8203, and the like. Although the MCU 8203 is provided in the indoor unit 8200 in FIG. 17A, the MCU 8203 may be provided in the outdoor unit 8204. Alternatively, the MCU 8203 may be provided in both the indoor unit 8200 and the outdoor unit 8204. When the MCU 8203 uses the transistor described in the above embodiment, the power saving of the air conditioner can be achieved.

In FIG. 17A, an MCU that uses the transistor described in the above embodiment is included in an electric refrigerator-freezer 8300. Specifically, the electric refrigerator-freezer 8300 includes a housing 8301, a refrigerator door 8302, a freezer door 8303, an MCU 8304, and the like. The MCU 8304 is provided in the housing 8301 in FIG. 17A. When the MCU 8304 uses the transistor described in the above embodiment, the power saving of the electric refrigerator-freezer 8300 can be achieved.

FIG. 17B illustrates an example of an electric vehicle. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, an MCU, or the like which is not illustrated. When an MCU uses the transistor described in the above embodiment, the power saving of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in appropriate combination with the structures described in the other embodiments.

This application is based on Japanese Patent Application serial no. 2013-064522 filed with Japan Patent Office on Mar. 26, 2013, the entire contents of which are hereby incorporated by reference.

What is claimed is:

1. A semiconductor device comprising:
   a semiconductor layer;
   a first source electrode overlapping a first part of the semiconductor layer;
   a second source electrode over the first source electrode, the second source electrode extending beyond an end portion of the first source electrode to be in direct contact with the semiconductor layer in a region being overlapped by a gate electrode;
   a first drain electrode overlapping a second part of the semiconductor layer;
   a second drain electrode over the first drain electrode, the second drain electrode extending beyond an end portion of the first drain electrode to be in direct contact with the semiconductor layer;
   a first sidewall in direct contact with the second source electrode and the semiconductor layer; and
   a second sidewall in direct contact with the second drain electrode and the semiconductor layer.

2. The semiconductor device according to claim 1, wherein a thickness of each of the second source electrode and the second drain electrode is greater than or equal to 5 nm and less than or equal to twice a shortest distance between the first sidewall and the second sidewall.

3. The semiconductor device according to claim 1, wherein a length of a channel formed in the semiconductor layer is less than or equal to 50 nm.

4. The semiconductor device according to claim 1, wherein the semiconductor layer includes an oxide semiconductor.

5. The semiconductor device according to claim 1, wherein the semiconductor layer is a stack including an oxide semiconductor layer and an oxide layer.

6. The semiconductor device according to claim 1, wherein each one of the first sidewall and the second sidewall is an insulating material containing oxygen.

7. The semiconductor device according to claim 1,
   wherein the first sidewall is an insulating material formed by oxidizing a part of the second source electrode, and
   wherein the second sidewall is an insulating material formed by oxidizing a part of the second drain electrode.

8. The semiconductor device according to claim 1, wherein the gate electrode does not overlap the first source electrode in a cross sectional view cut along a central line in a channel width direction of a transistor comprising the semiconductor layer.

9. A semiconductor device comprising:
a semiconductor layer;
a first source electrode over the semiconductor layer, the first source electrode being in direct contact with a first part of the semiconductor layer;
a second source electrode over the first source electrode, the second source electrode extending beyond an end portion of the first source electrode to be in direct contact with the semiconductor layer in a region;
a first drain electrode over the semiconductor layer, the first drain electrode being in direct contact with a second part of the semiconductor layer;
a second drain electrode over the first drain electrode, the second drain electrode extending beyond an end portion of the first drain electrode to be in direct contact with the semiconductor layer;
a first sidewall in direct contact with a side surface of the second source electrode and the semiconductor layer;
a second sidewall in direct contact with a side surface of the second drain electrode and the semiconductor layer;
a gate insulating layer over the first sidewall, the second sidewall and the semiconductor layer;
a gate electrode over the gate insulating layer, and
wherein the gate electrode overlaps the region.

10. The semiconductor device according to claim 9, wherein a thickness of each of the second source electrode and the second drain electrode is greater than or equal to 5 nm and less than or equal to twice a shortest distance between the first sidewall and the second sidewall.

11. The semiconductor device according to claim 9, wherein a length of a channel formed in the semiconductor layer is less than or equal to 50 nm.

12. The semiconductor device according to claim 9, wherein the semiconductor layer includes an oxide semiconductor.

13. The semiconductor device according to claim 9, wherein the semiconductor layer is a stack including an oxide semiconductor layer and an oxide layer.

14. The semiconductor device according to claim 9, wherein each one of the first sidewall and the second sidewall is an insulating material containing oxygen.

15. The semiconductor device according to claim 9,
wherein the first sidewall is an insulating material formed by oxidizing a part of the second source electrode, and
wherein the second sidewall is an insulating material formed by oxidizing a part of the second drain electrode.

16. The semiconductor device according to claim 9, wherein the gate electrode does not overlap the first source electrode in a cross sectional view cut along a central line in a channel width direction of a transistor comprising the semiconductor layer.

* * * * *